United States Patent
Davis

(10) Patent No.: US 9,437,425 B2
(45) Date of Patent: Sep. 6, 2016

(54) METHODS FOR INTEGRATING LEAD AND GRAPHENE GROWTH AND DEVICES FORMED THEREFROM

(71) Applicant: Solan, LLC, Salt Lake City, UT (US)

(72) Inventor: Mark Alan Davis, Springville, UT (US)

(73) Assignee: Solan, LLC, Salt Lake City, UT (US)

( * ) Notice: Subject to any disclaimer, the term of this patent is extended or adjusted under 35 U.S.C. 154(b) by 0 days.

(21) Appl. No.: 14/760,462

(22) PCT Filed: Jan. 10, 2014

(86) PCT No.: PCT/US2014/011155
§ 371 (c)(1),
(2) Date: Jul. 10, 2015

(87) PCT Pub. No.: WO2014/110450
PCT Pub. Date: Jul. 17, 2014

(65) Prior Publication Data
US 2015/0357189 A1    Dec. 10, 2015

Related U.S. Application Data

(60) Provisional application No. 61/751,774, filed on Jan. 11, 2013.

(51) Int. Cl.
| | | |
|---|---|---|
| H01L 29/16 | (2006.01) |
| H01L 23/532 | (2006.01) |
| H01L 21/02 | (2006.01) |
| H01L 21/285 | (2006.01) |

(52) U.S. Cl.
CPC ... *H01L 21/02527* (2013.01); *H01L 21/28512* (2013.01); *H01L 29/1606* (2013.01); *H01L 23/53276* (2013.01); *H01L 2924/0002* (2013.01)

(58) Field of Classification Search
CPC .................. H01L 21/1606; H01L 23/53276
See application file for complete search history.

(56) References Cited

U.S. PATENT DOCUMENTS

| | | | | |
|---|---|---|---|---|
| 8,610,278 B1* | 12/2013 | Ott | ...................... | H01L 23/5222 |
| | | | | 257/379 |
| 2010/0163285 A1* | 7/2010 | Marinero | ................. | H05K 1/09 |
| | | | | 174/257 |
| 2011/0059599 A1* | 3/2011 | Ward | ..................... | B82Y 30/00 |
| | | | | 438/507 |
| 2012/0006580 A1* | 1/2012 | Sandhu | ............. | H01L 23/53238 |
| | | | | 174/126.1 |
| 2012/0080661 A1* | 4/2012 | Saito | ................. | H01L 21/76876 |
| | | | | 257/29 |
| 2012/0080662 A1* | 4/2012 | Saito | ................. | H01L 21/28556 |
| | | | | 257/29 |
| 2012/0080796 A1* | 4/2012 | Wada | ................. | H01L 21/76834 |
| | | | | 257/762 |
| 2012/0132885 A1* | 5/2012 | Lippert | .................. | B82Y 10/00 |
| | | | | 257/9 |
| 2012/0228614 A1* | 9/2012 | Kitamura | .......... | H01L 21/02491 |
| | | | | 257/52 |
| 2012/0258587 A1* | 10/2012 | Kub | ..................... | C01B 31/0446 |
| | | | | 438/610 |
| 2013/0029460 A1* | 1/2013 | Sandhu | ................. | H01L 21/768 |
| | | | | 438/131 |

(Continued)

*Primary Examiner* — Kevin Parendo
(74) *Attorney, Agent, or Firm* — Morgan, Lewis & Bockius LLP

(57) ABSTRACT

Methods for forming integrated graphite-based structures with interconnections between leads and graphene layers are provided. A substrate is patterned to form a plurality of elements on the substrate. A trench separates a first element from an adjacent element in the plurality of elements. A lead is deposited on a side wall of the first element, and a layer from the top of the first element is removed to expose a portion of the lead. Both the deposition of the lead and removal of a layer from the top of the first element are conducted before generation of graphene layers on the top of the first element and the bottom of the trench. Thus, an integrated graphite-based structure having spatially isolated but electrically connected graphene layers is formed.

20 Claims, 14 Drawing Sheets

(56) References Cited

U.S. PATENT DOCUMENTS

| | | | |
|---|---|---|---|
| 2013/0056873 A1* | 3/2013 | Wada | H01L 23/5226 257/746 |
| 2013/0113102 A1* | 5/2013 | Bao | H01L 21/76846 257/751 |
| 2013/0217226 A1* | 8/2013 | Kitamura | H01L 23/53276 438/652 |
| 2014/0117548 A1* | 5/2014 | Katagiri | H01L 23/53276 257/751 |
| 2014/0167268 A1* | 6/2014 | Bao | H01L 23/53276 257/761 |

* cited by examiner

METHODS FOR INTEGRATING LEAD AND GRAPHENE GROWTH AND DEVICES FORMED THEREFROM

CROSS REFERENCE TO RELATED APPLICATION

The present application claims priority to U.S. Provisional Application No. 61/751,774, entitled "Methods for Integrating Lead and Graphene Growth and Devices Formed Therefrom," filed Jan. 11, 2013, which is hereby incorporated by reference herein in its entirety.

1. FIELD OF THE DISCLOSURE

Methods for integrating lead and graphene growth and integrated graphite-based structures and devices formed therefrom are provided. More particularly, methods for depositing lead before graphene growth and integrated graphite-based structures and devices having interconnected leads and graphene layers are provided.

2. BACKGROUND

Graphite-based structures, e.g. graphene quantum dots, graphene nanoribbons (GNRs), graphene nanonetworks, graphene plasmonics, and graphene super-lattices, exhibit many exceptional chemical, mechanical, electronic and optical properties, and are desirable for use in electronic devices, composite materials, and energy generation and storage. Such graphite-based structures in general comprise one or more graphene layers that are in electrical communication with one or other, or with an external circuit. Each graphene layer is typically nanometers thick and has a characteristic dimension (e.g., length or width) that also is in the nanometer range. Connecting such graphene layers, in particular graphene layers with horizontally oriented graphene sheets, imposes great challenges in the development of fabrication methods that can produce graphite-based structures with consistent and reliable lead connections to achieve desired functionalities.

Current methods deposit leads after graphene growth or exfoliation. To form a lead connection with a graphene layer, current methods typically rely on lead diffusion or migration into the graphene layer. In some cases, current methods also require additional processes to facilitate the formation of a lead connection. Graphite-based structures and devices formed by such methods experience many problems including lead connection integrity, additional complex processes, loss of functional graphene surface, as well as structural or functional failure of the graphite-based devices.

One drawback with the current methods is related to the integrity of the lead connections. For example, a lead deposited on a graphene layer having horizontally oriented graphene sheets forms a lead that is usually not in full contact with all of the graphene sheets in the graphene layer. Instead, the lead is generally in contact only with the top graphene sheet. To form lead connection with the underlying graphene sheets, the lead is usually heated to assist lead diffusion into the graphene layer. One problem with this process exists in the difficulty of controlling the size, shape or depth of the lead because diffusion occurs in all directions, e.g., diffusing down through the graphene sheets as well as along the graphene sheets. Another problem with this process is the potential changes in structural, physical or chemical properties of the graphene layer as the lead migrates into the graphene layer. For example, the graphene layer may be oxidized under heat during the lead diffusion. In addition, a lead contact may be converted from an ohmic contact to a non-ohmic contact during this process.

Another drawback with current methods is related to the complex processes that are required for the formation of lead connection. Because the current methods deposit leads after graphene growth or exfoliation, the graphene layer has to be isolated or etched into specific geometries before the deposition of a lead in order to achieve desired functionality. However, graphene can be difficult to process because maintaining selectivity when etching carbon-based materials is difficult in relation to other materials. In addition to etching, several other processes are required using the current methods for the formation of the lead connection. These processes include the deposition of the lead after etching and processes that facilitates adhesion and migration of lead into the graphene layer.

The required etching process before lead deposition imposes further concerns on the current methods: the loss of the functional graphene surface and unsatisfactory packing density. The ability to pack structures and devices onto a surface with high packing density and larger functional graphene surfaces is an important issue, because packing density and functional graphene surfaces determine functionalities of devices such as efficiency of solar cells or detectors. However, current techniques use horizontal isolation, resulting in the loss of the functional graphene surfaces.

There are other drawbacks with current manufacturing methods. In the first instance, horizontal leads typically have a width that is 500 nm or larger. What is desired, however, are leads that are 3 nm to 10 nm wide. However, connecting leads that are only 3 nm to 10 nm wide to an external circuit generally requires a large bonding pad area. Because of this and other problems, such as those described above, the graphite-based devices fabricated by the current methods are prone to structural or functional failures were they to be used to incorporate leads that are only 3 nm to 10 nm wide.

Given the above background, there is a need in the art for improved fabrication methods that can produce consistent and reliable graphite-based structures with interconnected leads and graphene layers. There is further need in the art for improved fabrication methods that time can produce interconnected leads that have widths that are in the nanometer range (e.g., having widths of less than 100 nm), rather than in the micrometer range.

3. SUMMARY

The present disclosure provides methods for fabricating integrated graphite-based structures with interconnections between leads and graphene layers and graphite-based structures and devices formed therefrom. One aspect of the present disclosure provides a method that comprises patterning a substrate to define the desired structure, forming a lead on a selected surface or surfaces, exposing a portion of the lead and generating graphene layers on desired surfaces. Both the deposition of the lead and exposure of a portion of the lead are conducted before generation of graphene layers. In some embodiments, the substrate is patterned to form a plurality of elements on the substrate, with each element separated from an adjacent element by a trench. The leads are deposited on one or more side walls of the elements. By removing a layer from the top of the elements, upper ends of the deposited leads are exposed, such that after the graphene generation, the leads electrically connect graphene layers generated on the top of the elements with graphene layers generated at the bottom of the trenches.

In some embodiments, the method further comprises additional or optional processes, including doping selectively the substrate with carbon to produce a carbide layer in the substrate, or doping the substrate with one or more dopants to form a barrier, a junction, an insulator or a connector in the structure. Doping the substrate with carbon is generally conducted after patterning the substrate but prior to generating graphene layers, and doping the substrate with one or more dopants can be conducted either before or after the generation of graphene layers. In some embodiments, the method further comprises selectively depositing a graphene generation material on a selected surface or surfaces when the substrate comprises a dielectric material. Deposition of a graphene generation material is in general conducted after patterning the substrate.

Another aspect of the present disclosure provides a graphene device topography comprising leads interconnected with graphene layers. In some embodiments, the graphene device topography comprises a plurality of elements and trenches. While graphene layers generated on elements are spatially isolated from graphene layers generated on trenches, these graphene layers are electrically connected through leads deposited on side walls of the elements. The elements and trenches have various configurations. In some embodiments, the elements are ribs, pillars, mesas, or suitable geometries for plasmonic effects. In some embodiments, the elements have holes.

In some embodiments, graphene layers generated on the top of the elements have different characteristic dimensions than graphene layers generated at the bottom of the trenches to achieve desired functionalities, for example, for absorbing or emitting photons in a different wavelength range. In some embodiments, graphene layers generated on the top of the elements and at the bottom of the trenches have the same characteristic dimension, for example, for the purpose of absorbing or emitting photons in a specific wavelength range.

Various other aspects of the present disclosure provide electrical wiring of integrated graphite-based devices to achieve desired functionality or produce different outputs. The leads can be connected to one another or to an external circuit, independently or collectively, in series or in parallel. In some embodiments, leads deposited on left walls of the elements are connected to a common bus and leads deposited on right side walls of the elements are connected to another common bus, thus producing an integrated graphite-based device that can absorb or emit photons in a wide wavelength range. In some embodiments, connection of leads to a common bus are alternating between the leads deposited on left walls and deposited on right side walls of the elements, thus producing an integrated graphite-based device that targets absorption or emission of photons in a specific wavelength range. In some embodiments, each lead is individually connected to a metal pad or other connectors.

4. BRIEF DESCRIPTION OF THE DRAWINGS

The accompanying drawings, which are incorporated into and constitute a part of this specification, illustrate one or more embodiments of the present disclosure and, together with the detailed description, serve to explain the principles and implementations of the present disclosure.

5. DETAILED DESCRIPTION

Figure 1:
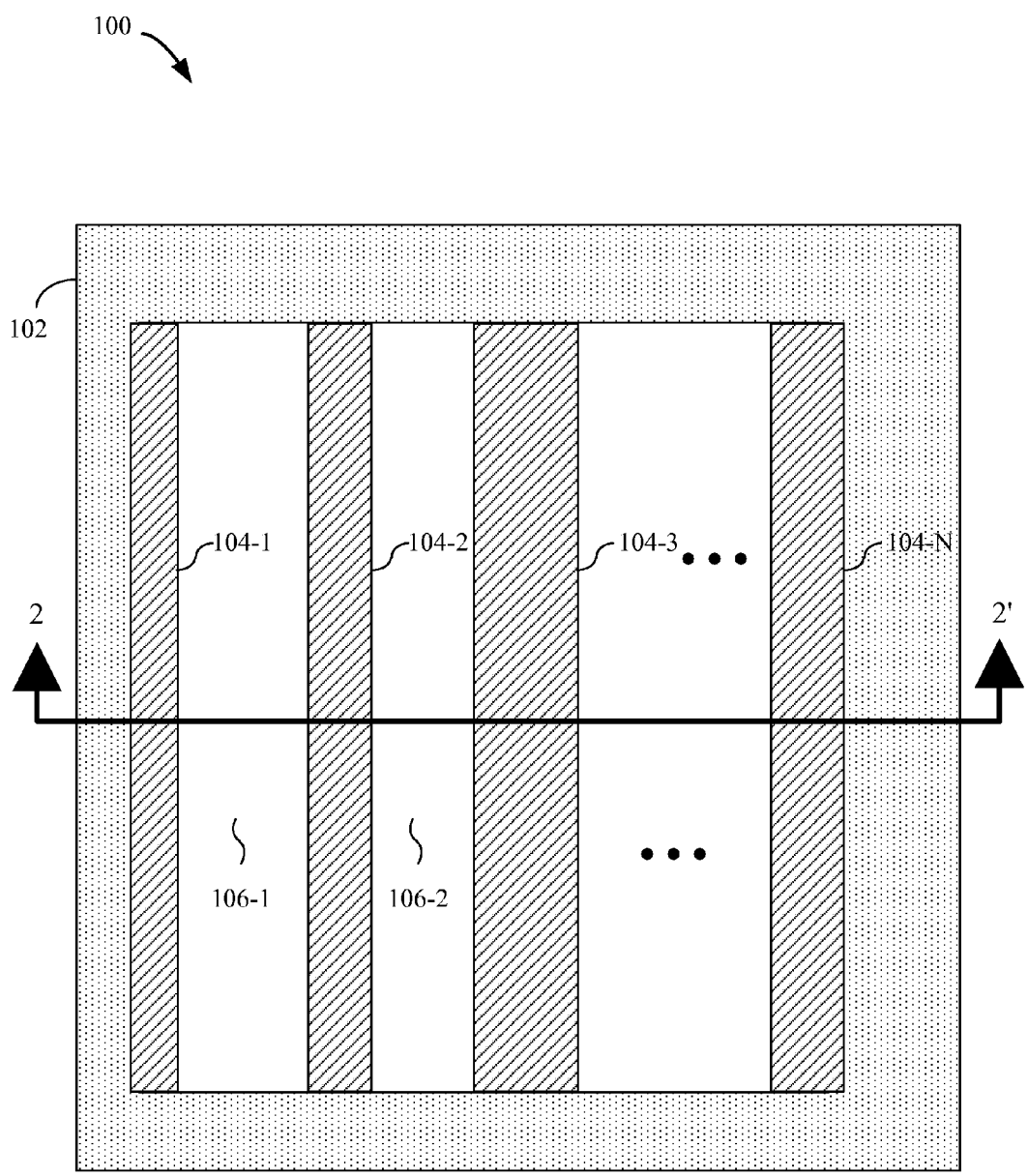
FIG. 1 illustrates a top view of an exemplary integrated graphene device topography fabricated by exemplary methods in accordance with an embodiment of the present disclosure.

Embodiments of the present application are described in the context of graphene device topography with integration of lead and graphene growth and in the context of methods for fabricating the integrated topography or integrated graphite-based structures. Exemplary methods include patterning a substrate to form or define a desired topography, depositing an electrically conducting material to form a lead, removing a layer from a selected surface to expose a portion of the lead, and generating spatially isolated but electrically connected graphene layers. Exemplary methods further include various additional, optional, or alternative processes such as doping or deposition processes if desired. Exemplary methods of the present application can be used to fabricate graphite-based diodes, transistors, LEDs, solar cells, photodetectors, or other devices, or any combination thereof.

Exemplary methods of the present disclosure deposit a lead before graphene growth. As a result, exemplary methods of the present disclosure have many advantages. For example, exemplary methods of the present disclosure eliminate the difficult graphene etching process and some additional processes such as the lead diffusion process required by the existing methods. By elimination of the graphene etching process, exemplary methods of the present disclosure also reduce or eliminate the loss of functional graphene surfaces. Another advantage relates to the integrity of the leads. Using exemplary methods of the present disclosure, a lead forms a full contact with all of the graphene sheets in a graphene layer. Exemplary methods of the present disclosure have many other advantages, which will be described in advantages section 5.3.

Exemplary integrated topography or structures include spatially isolated graphene layers that are electrically connected, jointly or independently, to one another through leads. In some embodiments, the leads are electrically connected to external circuits or external sources. In some embodiments, the spatially isolated graphene layers are generated on a plurality of elements and/or on a plurality of trenches that separate the elements, and the leads are formed on side walls of the elements. The graphene layers generated on elements and trenches are continuous or overlapping on a common plane while being isolated from each other on a plane substantially orthogonal to the common plane. Such structures provide additional surface areas for absorbing or emitting photons, thereby enhancing functionalities of devices such as efficiency of solar cells or photodetectors.

Those of ordinary skill in the art will realize that the following detailed description of the present application is illustrative only and is not intended to be in any way limiting. Other embodiments of the present application will readily suggest themselves to such skilled persons having benefit of this disclosure. Reference will now be made in detail to implementations of the present application as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

5.1. Definition

It will be understood that, although the terms "first," "second," etc. are optionally used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

As used herein, the term "substrate" refers to a solid substance generally in a form of a thin slice. The substrate can be planar or flexible, and can comprise dielectric, semiconducting or metallic materials, such as glass, Si, $SiO_2$, SiC, Cu, Ni, or other materials. In some embodiments, the substrate is made of poly methyl methacrylate (PMMA), polyethylene terephthalate (PET), polyvinyl alcohol (PVA), or cellulose acetate (CA). Exemplary dielectric materials that can be used for substrates include, but are not limited to, glass, silicon dioxide, neoceram, and sapphire. Exemplary semiconducting materials that can be used for substrates include, but are not limited to, silicon (Si), silicon carbide (SiC), germanium (Ge), boron nitride (BN), and molybdenum sulfide (MoS). Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof. In some embodiments the substrate comprises a metal foil or a metal slug. In some embodiments the substrate comprises Si, $SiO_2$, SiC, Cu, Ni, or other materials. In some embodiments, the substrate substantially comprises neoceram, barosilicate glass, germanium arsenide, a IV-V semiconductor material, a substantially metallic material, a high temperature glass, or a combination thereof. In some embodiments, the substrate is made of glass. Any of a wide variety of glasses can be used to make the substrate, some of which are described here. In some embodiments, the substrate is made of silicon dioxide ($SiO_2$) glass. In some embodiments, the substrate is made of soda lime glass formed from silicon dioxide, soda (e.g., sodium carbonate $Na_2CO_3$), or potash, a potassium compound, and lime (calcium oxide, CaO). In some embodiments, the substrate is made of lead glass, such as lead crystal or flint glass. In some embodiments, silicon dioxide glass doped with boron, barium, thorium oxide, lanthanum oxide, iron, or cerium(IV) oxide is used to make the substrate. In some embodiments, the substrate is made of aluminosilicate, borosilicate (e.g., PYREX®, DURAN®, SIMAX®), dichroic, germanium/semiconductor, glass ceramic, silicate/fused silica, soda lime, quartz, or chalcogenide/sulphide. In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry. In some embodiments the substrate is crystalline (e.g., mono-crystalline or polycrystalline).

As used herein, the term "sheet" refers to a substantially two-dimensional or one-atom thick substance. For example, a "graphene sheet" refers to one-atom-thick substance with carbon atoms arranged in a hexagonal lattice. A "graphene sheet" also refers to a carbon-based sheet which comprises additional materials such as boron, oxides, dopants and/or edge atomic substitutes.

As used herein, the term "graphene layer" or "graphite layer" refers to one or more graphene sheets (e.g., one, a few, several, several tens, several hundreds or several thousands of graphene sheets). The thickness of a graphene layer can range from a nanometer to several micrometers, or to several tens of micrometers depending upon the number of graphene sheets in the graphene layer. Final graphene layers produced by the processes disclosed in this application can have a thickness in nanometers, and preferably less than fifty nanometers. The terms "graphene layer" and "graphite layer" are interchangeable in the present disclosure.

As used herein, the term "graphite-based structure," "graphene device topography," "integrated graphite-based structure," or "integrated graphene device topography" refers to a structure having at least two spatially isolated graphene layers in electrical communication with each other through at least one lead that is formed on a surface of the structure. The terms "graphite-based structure," "graphene device topography," "integrated graphite-based structure," and "integrated graphene device topography" are interchangeable in the present disclosure.

As used herein, the term "lead" refers to an electrical conductor configured to be in electrical contact with at least one graphene layer. A lead can comprise a metallic material or any other electrically conducting material (e.g., a conductive transparent oxide such as indium tin oxide), and can be of any shape, size, or orientation. In some embodiments, a lead is a metallic layer formed or deposited on one or more surfaces of a graphene device topography or on a portion of a surface of a graphene device topography. The terms "lead" and "metallic layer" are interchangeable in the present disclosure.

As used herein, the term "element" refers to a feature configured or generated on a substrate. In general, at least a portion of the element is on or above the substrate. The element can be of any shape, size, or orientation. Exemplary elements include ribs, ribbons, pillars, mesas, geometries that produce or promote plasmonic effects or other configurations. "Rib" or "ribbon" herein refers to a feature having a width that is less than the length. In some embodiments, "rib" and "ribbon" are interchangeable. "Pillar" herein refers to substantially circular, ovoid, regular or irregular features. "Mesa" herein refers to an island isolated from other features on the substrate or a plateau on the substrate. In general, a mesa has at least one dimension that is relatively large and thus can be used as a base for further processing of more complex structures. In some embodiments, a mesa has a topographical height feature, providing a capability for vertical isolation and/or size for desired functionality.

As used herein, the term "trench" refers to a space that separates two adjacent elements. It can be a recess formed in the substrate such as by etching, a space on or above the substrate formed for example by depositing two adjacent elements on or above the substrate, or a combination thereof. A trench can be of any shape or size as long as it separates two adjacent elements. In some embodiments, it is deep and/or has a width that is smaller than a characteristic length.

As used herein, the term "orthogonal projection onto a common plane" and similar phrases means to project an image of a surface onto a plane without enlarging the source feature that is being projected. Thus, the dimensions of the contours of the surface (where here the feature being projected is the surface), when projected onto a common plane exactly match the actual dimensions of the surface that is projected. The construct of "orthogonal projection onto a common plane" has utility when two or more surfaces, which may be spatially separated on a z-axis, are projected along the z-axis onto a common plane. Such a projection is useful for illustrating whether the two projected surfaces are contiguous or overlapping.

As used herein, the terms "left" or "right", "top" or "bottom", "horizontal" or "vertical", "upper" or "lower", etc., are used to describe features of the exemplary embodiments with reference to the positions of such features as displayed in the figures. They are used for convenience in explanation, and do not limit features in such positions.

As used herein, the term "width" refers to a characteristic dimension, generally along a substantially horizontal direction, of a feature. Examples of such characteristic dimensions include a width of a rib or a ribbon and a diameter of a circular pillar. For irregular or complex geometries, the width may be defined by the square root of the horizontal cross-sectional surface area of such geometries. It will be understood that a fair amount of process variation occurs in the width of the features described herein. Thus, a rib may have a width that deviates within a certain process variation. Thus, in such instances, the width of such features is an average width or characteristic width, taking into account this process variation.

As used herein, the term "height" refers to a characteristic dimension, generally along a substantially vertical direction, of a feature. Examples of such characteristic dimensions include the height of an element, which may be defined by the vertical distance between the top surface of the element and the bottom surface of the corresponding trench. It will be understood that a fair amount of process variation occurs in the height of the features described herein. Thus, an element may have a height that deviates within a certain process variation. Thus, in such instances, the height of such features is an average height or characteristic height, taking into account this process variation.

As used herein, the term "average" refers to the arithmetic mean value, or some other measure of central tendency, of a characteristic dimension. In some embodiments, the top surface of an element or the bottom surface of a trench has a slope or an arcuate property. For instance, in a case of a circular pillar-like element having an arcuate top surface, the average width is the circumferential mean diameter of the circular pillar-like element and the average height is the circumferential mean height of the circular pillar-like element.

As used herein, the terms "dielectric" and "dielectric materials" refers to a materials that are poor conductors of electricity. As such, in various embodiments in accordance with the present disclosure, a dielectric material is a material that has a dielectric constant of 50 or less, 40 or less, 30 or less, 20 or less, or 10 or less.

5.2. Integration Methods and Integrated Devices

Figure 4:
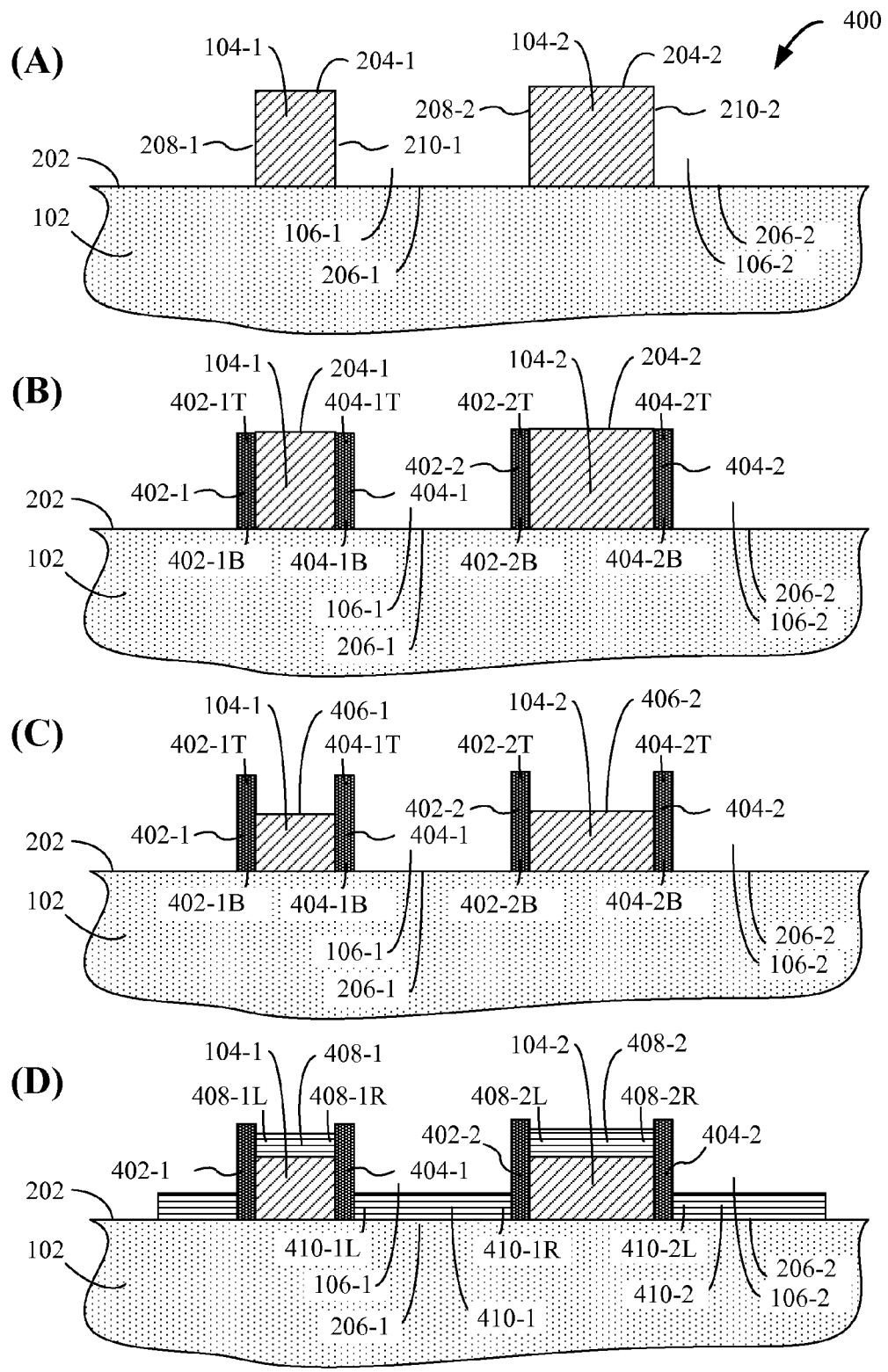
FIG. 4 illustrates exemplary processes for integrating lead and graphene growth in accordance with an embodiment of the present disclosure.
Figure 5:
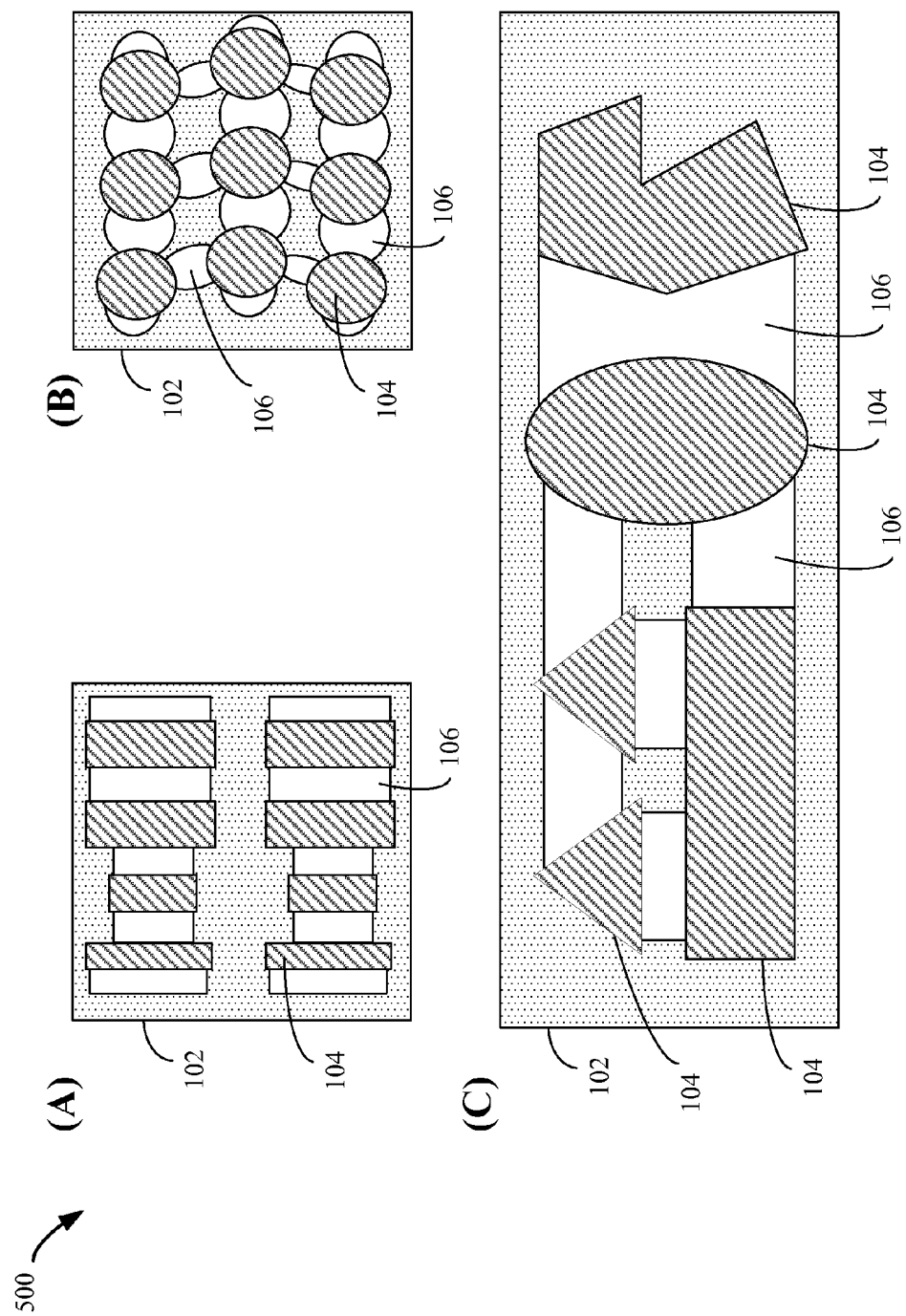
FIGS. 5A-5C illustrate alternative exemplary graphene device topographies fabricated by exemplary methods in accordance with an embodiment of the present disclosure.
Figure 6:
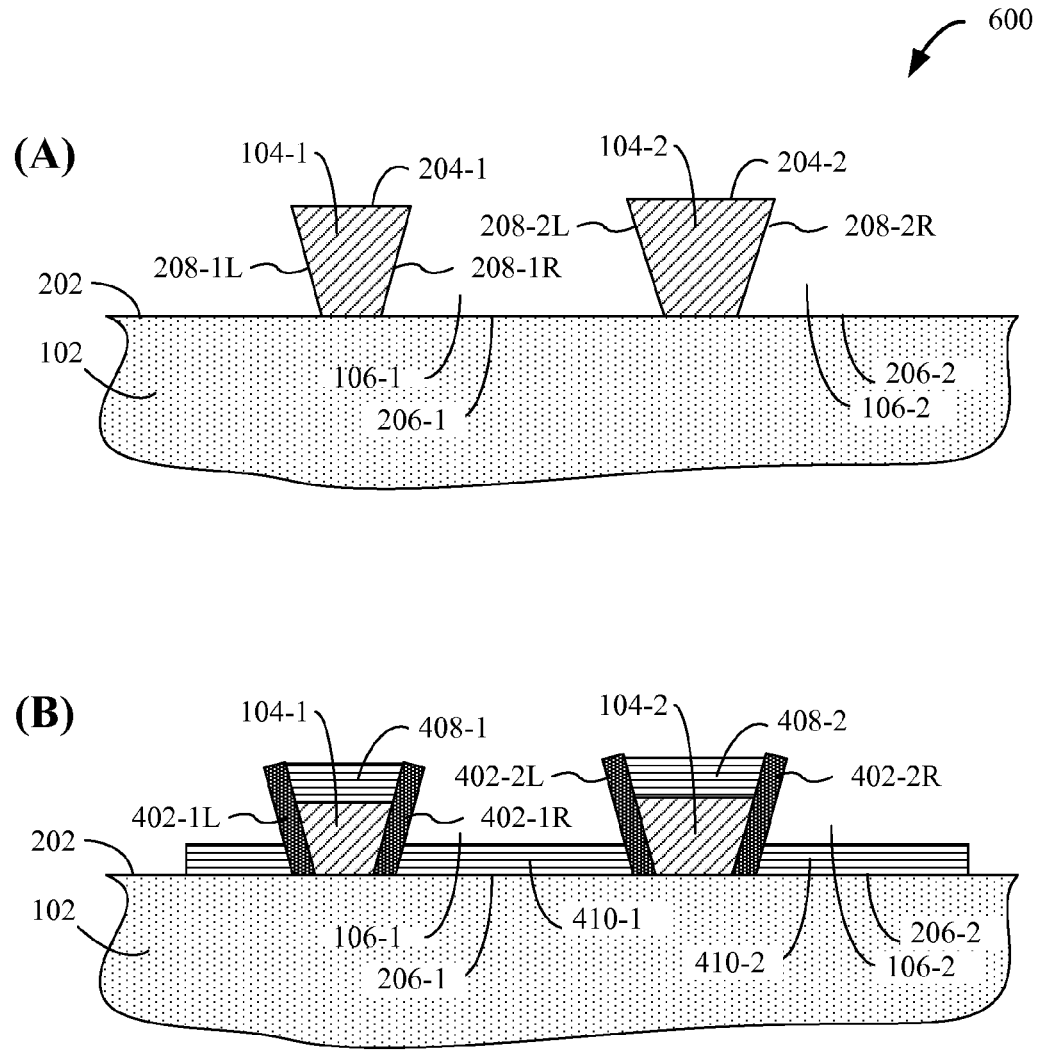
FIGS. 6A-6B illustrate other alternative exemplary graphene device topographies fabricated by exemplary methods in accordance with an embodiment of the present disclosure.
Figure 14:
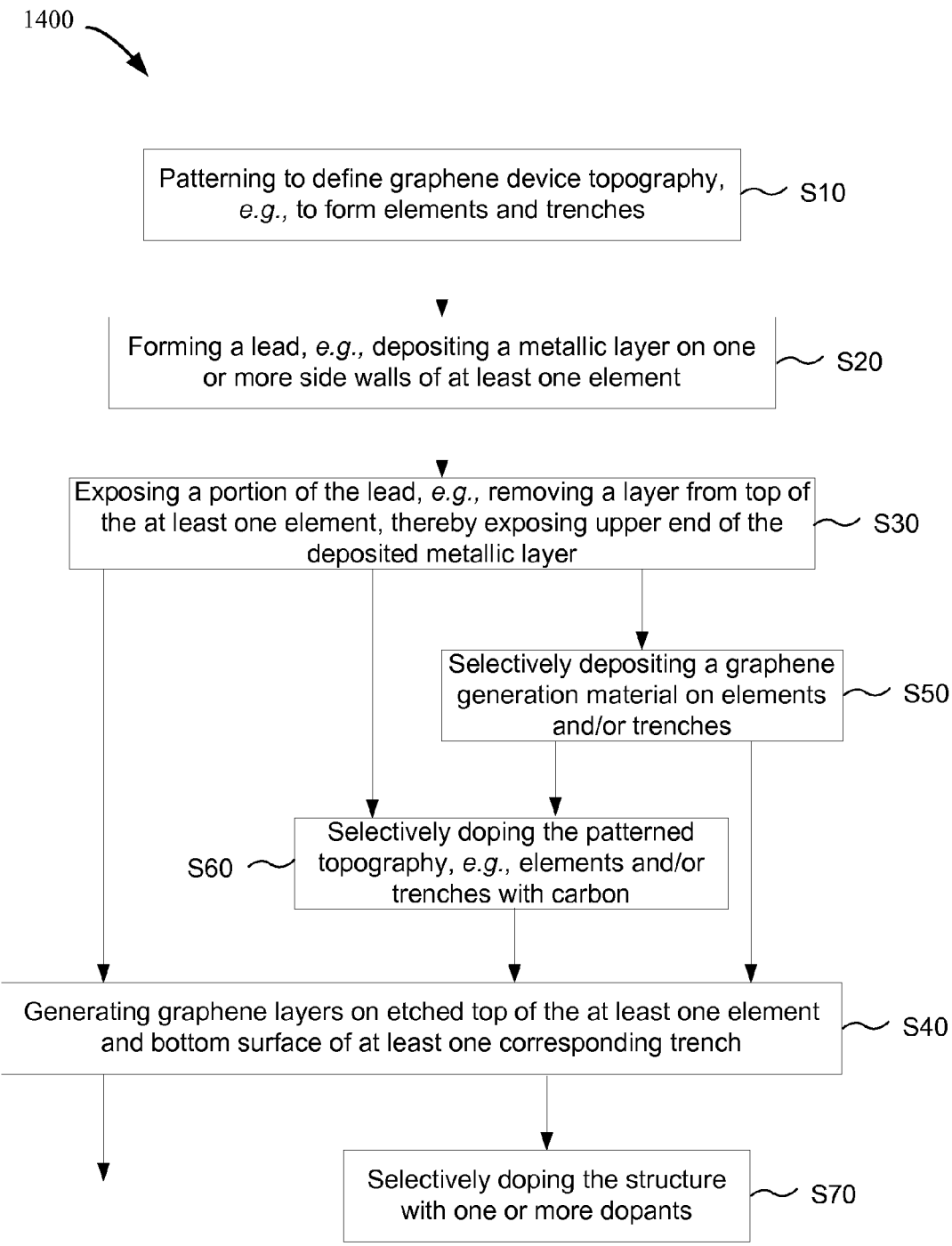

FIG. 14 illustrates a flowchart of an exemplary method 1400 for integrating lead and graphene growth in accordance with an embodiment of the present disclosure. As shown, the exemplary method 1400 of the present disclosure includes a step S10 for patterning the substrate to define graphene device topography or form a desired structure, a step S20 for depositing an electrically conducting material such as a metallic layer to form a lead, a step S30 for exposing a portion of the lead, and a step S40 for generating spatially isolated but electrically connected graphene layers. An exemplary detailed process is also depicted in FIG. 4, where FIGS. 4A, 4B, 4C, and 4D correspond to steps S10, S20, S30 and S40, respectively. The generation or growth of any graphene layers is conducted subsequent to the substrate patterning, lead deposition and exposure, thereby producing spatially separated but electrically connected graphene layers.

FIGS. 1-3, 5-6, and 9-12 shows exemplary integrated topographies or structures fabricated on a substrate 102 by exemplary methods of the present application. In various embodiments, the substrate 102 is made of a dielectric material, a semiconducting material, a metallic material, or a combination of such materials. Exemplary dielectric materials include glass, silicon dioxide, neoceram, and sapphire. Exemplary semiconducting materials include silicon (Si), silicon carbide (SiC), germanium (Ge), boron nitride (BN), and molybdenum sulfide (MoS). Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof In some embodiments, the substrate 102 is made of glass. Any of a wide variety of glasses can be used to make the substrate 102, some of which are described here. In some embodiments, the substrate 102 is made of silicon dioxide ($SiO_2$) glass. In some embodiments, the substrate 102 is made of soda lime glass formed from silicon dioxide, soda (e.g., sodium carbonate $Na_2CO_3$), or potash, a potassium compound, and lime (calcium oxide, CaO). In some embodiments, the substrate 102 is made of lead glass, such as lead crystal or flint glass. In some embodiments, silicon dioxide glass doped with boron, barium, thorium oxide, lanthanum oxide, iron, or cerium(IV) oxide is used to make the substrate 102. In some embodiments, the substrate 102 is made of aluminosilicate, borosilicate (e.g., PYREX®, DURAN®, SIMAX®), dichroic, germanium/semiconductor, glass ceramic, silicate/fused silica, soda lime, quartz, or chalcogenide/sulphide. In some embodiments, the substrate is made of poly methyl methacrylate (PMMA), polyethylene terephthalate (PET), polyvinyl alcohol (PVA), or cellulose acetate (CA).

In various embodiments, the substrate 102 is patterned to form a plurality of elements, such as elements 104-1, 104-2, . . . 104-N in FIG. 1, which illustrates a top view of an exemplary integrated graphite-based structure 100 fabricated by exemplary methods of the present disclosure. This process is performed in step S10 of the exemplary method 1400 depicted in FIG. 14, and is also illustrated in FIG. 4A. In addition to the plurality of elements, the exemplary integrated graphite-based structure 100 includes a plurality of trenches, such as trenches 106-1, 106-2. Each respective element in the plurality of elements is separated from an adjacent element on the substrate by a corresponding trench in a plurality of trenches in the substrate. For example, element 104-1 is separated by trench 106-1 from element 104-2, which in turn is separated from element 104-3 by trench 106-2.

Patterning the substrate in step S10 can be achieved using any standard lithography technique including, but not limited to various deposition methods and etching methods. Exemplary deposition/etch techniques include wet etching, plasma etching, ion beam etching, reactive ion etching, sputtering and evaporation, atomic layer deposition, and catalytic deposition. More details regarding these deposition techniques are disclosed in Section 6 below. Exemplary etching methods are disclosed in Section 7 below. In some embodiments, patterning the substrate also involves one or more generic lithographic processes such as substrate preparation, photoresist application, soft bake, exposure of photoresist, post exposure bake, photoresist development, and hard bake. Details and purposes of these processes are described in Section 7, and are also described, for example, in Van Zant, Microchip Fabrication, Forth Edition, McGraw-Hill, New York, 2000.

In some embodiments, the substrate 102 is patterned by depositing an element or a plurality of elements on the substrate, using one or more methods described in Section 6. For example, FIG. 2A illustrates patterning the substrate 102 by depositing a plurality of elements 104-1, 104-2, . . . 104-N on a surface 202 of the substrate 102. FIG. 2A is a cross-sectional view of the exemplary graphite-based structure 100 taken along line 2-2' in FIG. 1. A trench is formed after deposition of any two adjacent elements, such as trench 106-1 formed by the deposition of element 104-1 and element 104-2.

In some embodiments, patterning the substrate 102 is achieved by etching a trench or trenches in the substrate using one or more methods described in Section 7. This process is depicted in FIG. 2B. As shown, elements 104-2 are formed by etching trench 106-1 and trench 106-2 and is separated from element 104-1 and element 104-3 by trench 106-1 and trench 106-2, respectively.

In some embodiments, patterning the substrate is achieved by a combination of deposition and etching in the substrate, as depicted in FIG. 2C. As shown, element 104-2 includes a lower portion formed by etching and an upper portion formed by deposition. Such an element can be fabricated either by first etching the substrate to form the lower portion of the element and then depositing the upper portion on the lower portion of the element, or by depositing the upper portion on the substrate and then etching the substrate to form the lower portion of the element. A trench in such embodiments is a space established collectively by both the lower and upper portions of the two adjacent elements.

An element in the plurality of elements has a top surface and one or more side walls. For example, element 104-1 has a top surface 204-1, a side wall 208-1 and a side wall 210-1. The side walls 208-1, 210-1 are referred to as the left and right side walls of the element 104-1, respectively. A trench in the plurality of trenches has a bottom surface, for example, trench 106-1 has a bottom surface 206-1 and trench 106-2 has a bottom surface 206-2. One of ordinary skill in the art will appreciate that the terms "left", "right", "top" and "bottom" are used to describe features of the exemplary embodiments with reference to the relative positions of such features as displayed in the figures. They are used herein solely for convenience in explanation.

In various embodiments, the top surface of an element is separated from the bottom surface of a corresponding trench by a side wall of the respective element. For example, the top surface 204-1 of element 104-1 is separated from the bottom surface 206-1 of trench 106-1 by the right side wall 210-1 of element 104-1; the top surface 204-2 of element 104-2 is separated from the bottom surface 206-1 of trench 106-1 by the left side wall 210-2 of element 104-2.

In various embodiments, the top surface of an element is characterized by a first elevation, and the bottom surface of a corresponding trench is characterized by a second elevation that is different than the first elevation. It will be appreciated that the first elevation may vary across that top surface of the element within certain process variation limits and that the second elevation may also deviate within certain process variation limits. Nevertheless, the top surface of the element may still be characterized by the first elevation and the bottom surface may still be characterized by the second elevation. Generally, the top surface of the respective element and the bottom surface of the corresponding trench can be formed at various elevations. For example, FIG. 2A depicts the bottom surfaces 206 of trenches 106 formed by deposition of elements 104 that are essentially at the same elevation as the surface 202 of the substrate 102, within process variation limits. FIG. 2B depicts the bottom surfaces 206 of trenches 106 formed by etching are in general located within the substrate 102 and below the surface 202 of the substrate 102. However, the top surfaces 204 of elements 104 formed by etching trenches in the substrate are essentially at the same elevation as the surface 202 of the substrate 102. FIG. 2C depicts patterning the substrate by a combination of deposition and etching in the substrate, producing neither the top surfaces 204 of elements 104 nor the bottom surfaces 206 of trenches 106 at the same elevation as of the surface 202 of the substrate 102. In such embodiments, the top surfaces 204 of elements 104 are generally above the surface 202 of the substrate 102 and the bottom surfaces 206 of trenches 106 are generally below the surface 202 of the substrate 102.

Figure 2:
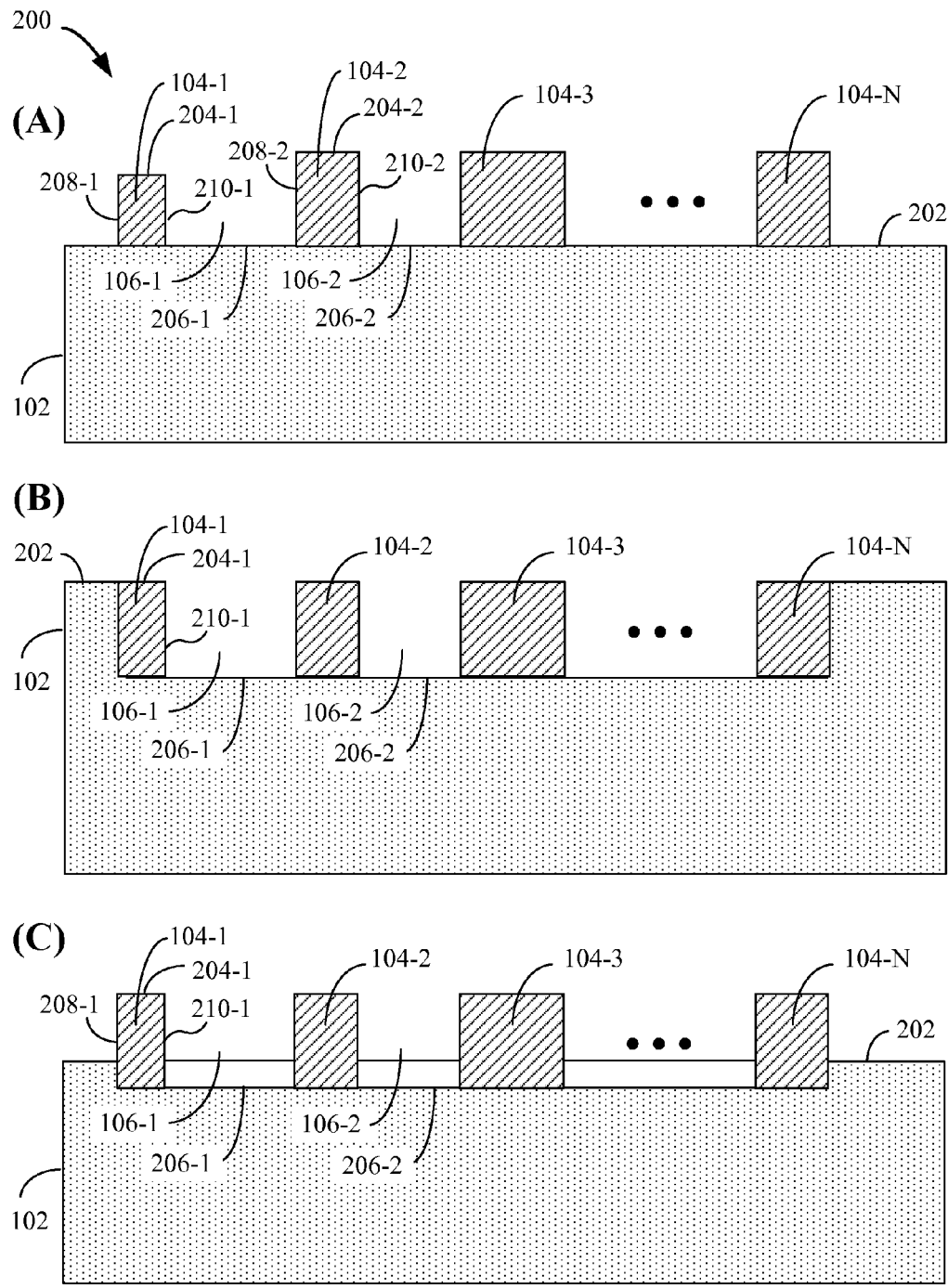
FIG. 2A illustrates a cross-sectional view of the exemplary integrated graphene device topography taken along line 2-2' of FIG. 1 and fabricated by an exemplary method in accordance with an embodiment of the present disclosure.
FIG. 2B illustrates a cross-sectional view of the exemplary integrated graphene device topography taken along line 2-2' of FIG. 1 and fabricated by another exemplary method in accordance with an embodiment of the present disclosure.
FIG. 2C illustrates a cross-sectional view of the exemplary integrated graphene device topography taken along line 2-2' of FIG. 1 and fabricated by still another exemplary method in accordance with an embodiment of the present disclosure.

By way of illustration, top surfaces of elements and bottom surfaces of trenches depicted in FIG. 2 are flat and horizontal. One of ordinary skill in the art will appreciate, however, that the top surface of an element or the bottom surface of a trench does not necessarily need to be flat or horizontal. In some embodiments, the top surface of an element or the bottom surface of a trench has a slope or an arcuate property, or deviates within desired process variation. In such embodiments, the first elevation or the second elevation is deemed to be the average elevation, or some other measure of central tendency, of the top surface or the bottom surface, respectively.

In some embodiments, an integrated graphite-based structure of the present disclosure includes a plurality of identical elements or a plurality of identical trenches (within process variation constraints). In some embodiments, an integrated graphite-based structure of the present disclosure includes an element that has a different physical dimension (e.g. width) than another element in the plurality of elements or includes a trench that has a different physical dimension (e.g. width) than another trench in the plurality of trenches. For example, FIG. 2A shows an element 104-1 separated from a taller and wider element 104-2 by a wider trench 106-1, and a relatively larger and taller element 104-3 separated from element 104-2 by a narrower trench 106-2. One of ordinary skill in the art will appreciate that the difference between elements or trenches can manifest in other physical parameters and all such differences are within the scope of the present disclosure.

In various embodiments, the top surface of the respective element is characterized by an element width and the bottom surface of the corresponding trench is characterized by a trench width that can be either the same as or different than the element width. The right side wall of the respective element is characterized by a right side height and the left side wall of the respective element is characterized by a left side height that can be either the same as or different than the right side height of the same element.

Figure 3:
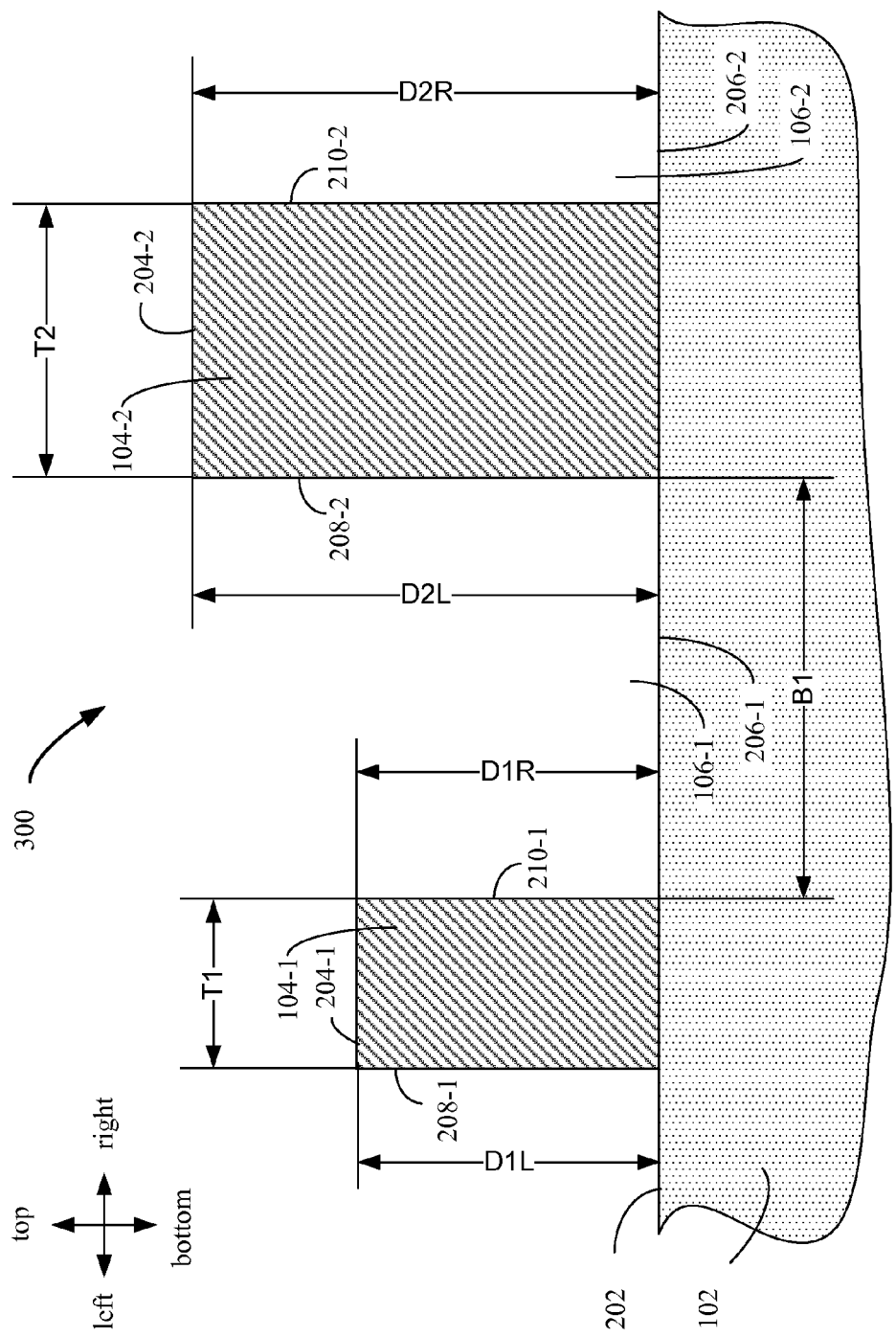
FIG. 3 illustrates an exemplary integrated graphene device topography with dimensions for definition of an aspect ratio in accordance with an embodiment of the present disclosure.

For illustration purposes, FIG. 3 depicts two elements 104-1 and 104-2 formed on a substrate 102. The first element 104-1 includes a top 204-1, a left side wall 208-1 and a right side wall 210-1; the second element 104-2 includes a top 204-2, a left side wall 208-2 and a right side wall 210-2. The first trench 106-1, which is the space established between the elements 104-1 and 104-2, includes a bottom surface 206-1. The top surface 204-1 of the first element 104-1 is separated from the bottom surface 206-1 of the first trench 106-1 by the right side wall 210-1 of the first element 104-1; the top surface 204-2 of the second element 104-2 is separated from the bottom surface 206-1 of the first trench 106-1 by the left side wall 208-2 of the second element 104-2.

The top surface 204-1 of the first element 104-1 has a width indicated by T1. The left side wall 208-1 has a height indicated by D1L and the right side wall 210-1 has a height indicated by D1R which can be the same as or different than D1L. The top surface 204-2 of the second element 204-2 has a width indicated by T2 which can be the same as or different than T1. The left side wall 208-2 has a height indicated by D2L and the right side wall 210-2 has a height indicated by D2R which can be the same or different than D2L. The bottom surface 206-1 of the first trench 106-1 has a width indicated by B1.

In some embodiments, D1L, D1R, D2L, or D2R is between 25 nm and 1000 nm, between 1 μm and 5 μm, or between 5 μm and 10 μm. In some embodiments each of D1L, D1R, D2L, and D2R is between 25 nm and 1000 nm, between 1 μm and 5 μm, or between 5 μm and 10 μm.

In some embodiments, T1, T2 or B1 is between 10 nm and 20 nm, between 20 nm and 30 nm, between 30 nm and 50 nm, between 50 nm and 75 nm, between 75 nm and 100 nm, between 100 nm and 300 nm. In some embodiments each of T1, T2 and B1 is between 10 nm and 20 nm, between 20 nm and 30 nm, between 30 nm and 50 nm, between 50 nm and 75 nm, between 75 nm and 100 nm, between 100 nm and 300 nm.

In some embodiments, T1, T2, or B1 is dimensioned to facilitate absorption or emission of photons in a predetermined wavelength range. For example, in some embodiments, T1, T2 and B1 are configured to facilitate absorption or emission of photons in the same wavelength range. In some embodiments, T1 and T2 are configured to be the same but different than B1 to facilitate absorption or emission of photons in two different wavelength frequencies or wavelength ranges. In some embodiments, T1, T2 and B1 each has a different value to facilitate absorption or emission of photons in different respective wavelength frequencies or wavelength ranges, such as a blue wavelength frequency or range, a green wavelength frequency or range, and a red wavelength frequency or range.

In some embodiments, an aspect ratio is defined by the left or right side height of an element divided by the trench width of the corresponding trench. For example, a first aspect ratio is defined by D1R/B1 or D2L/B1, whichever is smaller. In some embodiments, the first aspect ratio equals to or is greater than 4:1. However, the present disclosure is not so limited and, in general any suitable aspect ratio is possible, including aspect ratios of 1:1 or less and 1:1 or greater. By way of illustration, FIGS. 1-3 show elements having a rib or ribbon-like shape. One of ordinary skill in the art will appreciate that exemplary methods of the present disclosure can be used to fabricate devices and/or structures with any of a variety of configurations, including devices with different shapes, sizes, number of elements, and orientation of elements. For instance, as shown in FIGS. 5A-5C, a structure fabricated by exemplary methods of the present disclosure can include a pillar-like or mesa-like element having a substantially circular, ovoid or polygonal shape. A structure can also include a combination of a rib-like element, a pillar-like element, a mesa-like element, or other elements. Similarly, a structure fabricated by exemplary methods of the present disclosure can include trenches having different shapes or sizes. Trenches can also be configured to separate adjacent elements in a row, in a column, or in any other orientation if desired.

In some embodiments, the orthogonal projection of a rib-like element on a common plane has a length and a width, with the length being between two times and five times of the width or at least two times of the width. In some embodiments, a rib-like element has a length up to 10 mm, up to 100 mm, up to 1 cm, up to 5 cm or up to 10 cm. In some embodiments, one dimension of a rib-like element spans the entire substrate. In some embodiments, the width of the rib-like element is between 1 nm and 10 nm, between 10 nm and 20 nm, between 20 nm and 30 nm, between 30 nm and 40 nm, between 40 nm and 50 nm, between 50 nm and 100 nm, or between 100 nm and 500 nm. In some embodiments, the orthogonal projection of a mesa-like element on a common plane has a size in any dimension that is between 10 nm and 100 nm, between 100 nm and 1 µm, or between 1 µm and 10 µm. In some embodiments, the orthogonal projection of a pillar-like element on a common plane is substantially circular, ovoid, or polygonal.

In addition to variations shown in FIGS. 5A-5C, physical parameters can be varied in other dimensions. For example, FIG. 6A depicts an exemplary embodiment 600 in which an element such as element 104-1 is tapered to form an upside down wedge. As a result, orthogonal projections of the surface 204-1 of element 104-1 and the surface 206-1 of the corresponding adjacent trench 106 onto a common plane are overlapping, thus providing a functional graphene surface that is larger than the physical surface area of the underlying substrate before the processing was initiated. Elements can be tapered, for example, by any standard etching processes that undercut a topographical feature, including re-entry etching a side wall of an element. More information on fabrication processes and structures with overlapping features can be found, for example, in a copending U.S. Patent Provisional Application No. 61/745,464, the entire content of which is hereby incorporated herein by reference.

In some embodiments, the functional graphene surface is more than ten percent larger than the physical surface area of the underlying substrate before the processing was initiated. In some embodiments, the functional graphene surface is more than fifteen percent, more than twenty percent, more than twenty-five percent, more than thirty percent, or more than forty percent larger than the physical surface area of the underlying substrate before the processing was initiated.

One of ordinary skill in the art will appreciate that the surfaces of elements or the surfaces of trenches are readily modifiable by additional or alternative processes, thus providing the top surfaces of elements or the bottom surfaces of trenches with different elevations, shapes, sizes or orientations. However, regardless of the processes used for patterning the substrate, the top surface of a respective element and the bottom surface of the corresponding trench are spatially separated by the left or right side wall, and/or the elevation of the surface of the element is different than the elevation of the surface of the corresponding trench. In some embodiments, the difference between these elevations equals the height of the left or right side wall.

Referring back to FIG. 14, after the substrate is patterned, a metallic layer is deposited on one or more selected surfaces of the patterned structures. The deposition of the metallic layer is conducted in step S20 and is also illustrated in FIG. 4B. The deposited metallic layer serves as a protection layer that inhibits graphene growth on the selected surfaces in the subsequent generation process, thereby spatially isolating two or more subsequently grown graphene layers. In the meantime, the deposited metallic layer serves as a lead that electrically connects the two or more subsequently grown graphene layers, thereby producing an integrated graphite-based structure or device.

For instance, in some embodiments, after the substrate has been patterned to include a plurality of elements, a metallic layer is deposited on left, right or both side walls of at least one element. By way of illustration, FIG. 4B depicts metallic layers 402-1, 404-1 respectively deposited on the left side wall 208-1 and right side wall 210-1 of the element 104-1 and metallic layers 402-2, 404-2 respectively deposited on the left side wall 208-2 and right side wall 210-2 of the element 104-2. Each deposited metallic layer has an upper end contacting the top of the element and a bottom end contacting the bottom of the corresponding trench. For instance, the metallic layer 404-1 has the upper end 404-1T contacting the top of the element 104-1 and the bottom end 404-1B contacting the bottom of the trench 106-1. Deposition of the metallic layers 402-1, 404-1, 402-2 and 404-2 takes place either concurrently or sequentially in accordance with the present disclosure.

Figure 8:
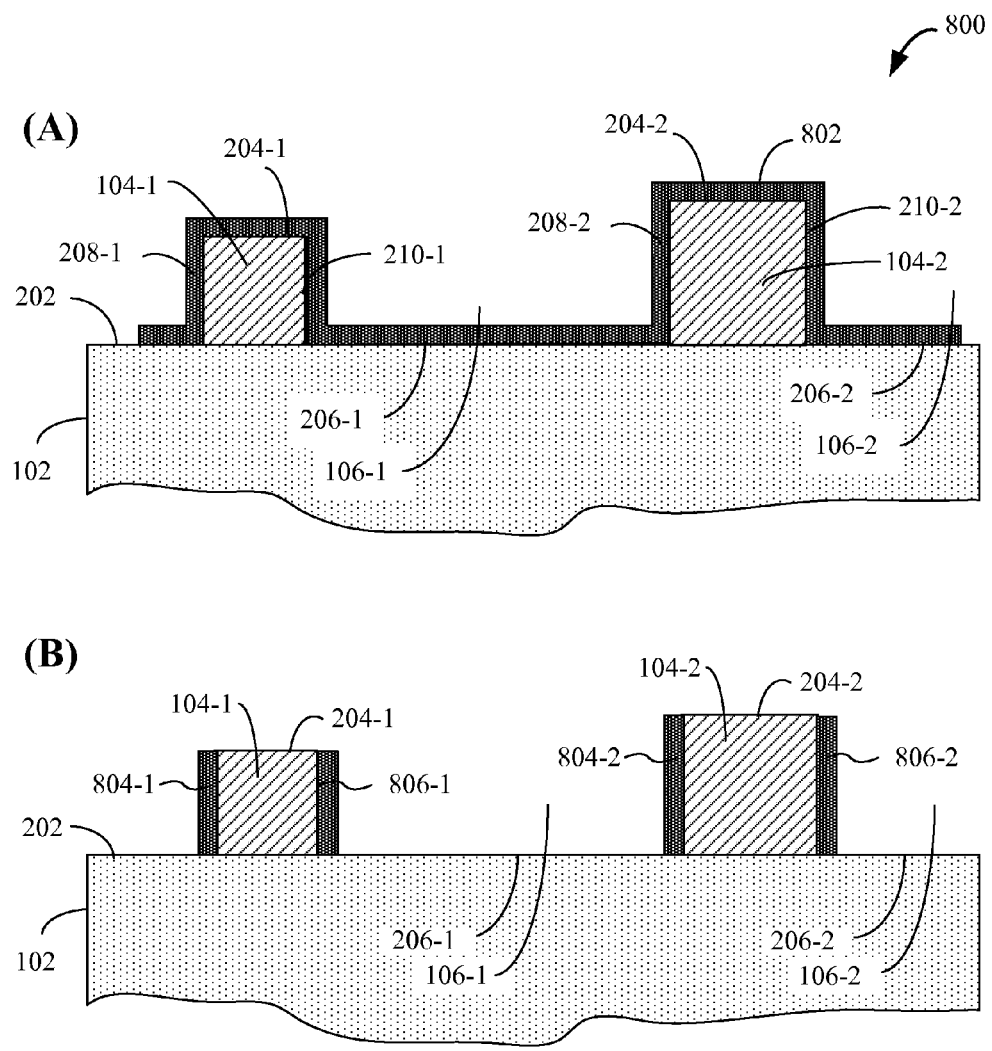
FIGS. 8A-8B illustrate an exemplary conformal method for depositing a lead on a selected surface of a defined topography in accordance with an embodiment of the present disclosure.

Various methods, including standard lithographic deposition methods, can be used to deposit a metallic layer on a selected surface or surfaces on the patterned structures. By way of illustration, FIG. 8 depicts an exemplary conformal deposition method 800, for example, using an atomic layer deposition (ALD) method to deposit a metallic layer. Since ALD is in general a conformal process, the full structure would be encapsulated by a thin metallic layer. As an example, FIG. 8A depicts deposition performed on a patterned structure having a plurality of elements and trenches.

The metallic layer 802 encapsulates the entire structure including the top surface 204-1, left side wall 208-1 and right side wall 210-1 of the element 104-1, the bottom surface 206-1 of the trench 106-1, and the top surface 204-2, left side wall 208-2, and right side wall 210-2 of the element 104-2.

To remove the metallic layer from surfaces where graphene growth is desired, a removal process such as an anisotropic or a directional etching process is performed after the conformal deposition. In the exemplary embodiment depicted in FIG. 8B, the metallic layers deposited on some surfaces of the elements, such as top surfaces 204-1 and 204-2, and on the some surfaces of the trenches, such as bottom surfaces 206-1 and 206-2, are removed. Because the etching is directional, the metallic layers deposited on the side walls, such as layers 804-1, 804-2, 806-1 and 806-2, or at least a sub-layer (portion) of it, remains, thereby inhibiting graphene growth on side walls in the subsequent generation process.

In some embodiments, other factors are used to control the deposition of a metallic layer on a selected surface, for example, deposition of a metallic layer on side walls of the elements but not on the bottom surfaces of the trenches. In some embodiments, these factors include, but are not limited to, patterning the substrate to have a predetermined aspect ratio equal using very small amount of reaction gases, using dilution gas to minimize resist reactions, using low bias on the substrate to reduce directionality, setting process conditions related to power and vacuum that reduce mean free path, and manipulating by-product generation that interferes with reaction chemistry.

Figure 13:
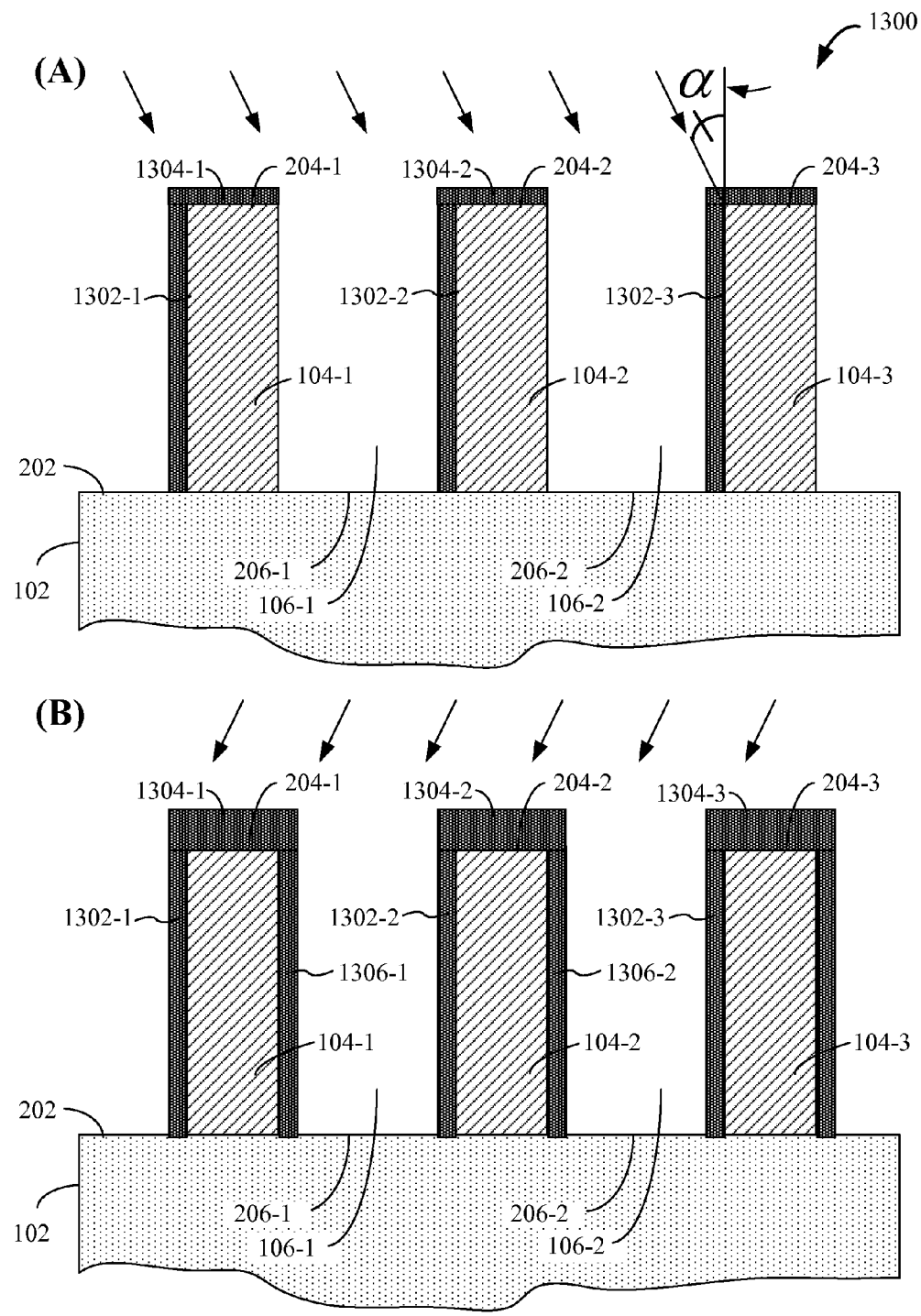
FIG. 13 illustrates an exemplary oblique angle deposition method for depositing a lead on a selected surface of a defined topography in accordance with an embodiment of the present FIG. 14 provides a flowchart of an exemplary method for fabricating an integrated graphene device topography on a substrate in accordance with an embodiment of the present disclosure.

FIG. 13 illustrates another exemplary method 1300 for depositing a metallic layer on a selected surface or surfaces. As shown, the exemplary method 1300 includes oblique angle deposition using, for example, a sputter or an evaporation system. In this process, the sputtering material or vapor flux arrives at an oblique angle from the substrate normal or from the patterned structures, as indicated by a in FIG. 13. For a given material and a set of deposition conditions, an appropriate oblique angle α is determined by the patterned structures. As an example, FIG. 13 illustrates oblique angle deposition of metallic layers on a patterned structure having a plurality of elements and trenches. In such embodiments, the oblique angle α is determined by the aspect ratios. For an aspect ratio of 4:1 or greater, the corresponding oblique angle α is between 30 degrees and 75 degrees or between 30 degrees and 90 degrees.

Depending on the application, desired functionality or patterned structure, in some embodiments, the exemplary oblique angle deposition method 1300 is conducted multiple times, each time at a different oblique angle. For example, as illustrated in FIG. 13A, the oblique angle deposition is first conducted with an oblique angle α, producing metallic layers on left side walls such as a metallic layer 1302-1 on the left side wall of the element 104-1 and a metallic layer 1302-2 on the left side wall of the element 104-2. Then, the oblique angle deposition is conducted with an oblique angle that mirrors the oblique angle α, as shown in FIG. 13B, thereby producing metallic layers on right side walls such as a metallic layer 1306-1 on the right side wall of the element 104-1 and a metallic layer 1306-2 on the right side wall of the element 104-2. The undesired deposition of metallic layers, such as 1304-1, 1304-2 and 1304-3, on the top surfaces of the elements, can be removed subsequently, for example, using an anisotropic or a directional etching process as described above.

Materials suitable for forming the metallic layer include, but not limited to, titanium (Ti), nickel (Ni), copper (Cu) or palladium (Pd). In some embodiments where the elements or trenches comprise an initial metallic material, the metallic material selected for depositing on side walls is less reactive than the initial metallic material, and/or process parameters are set to enhance one reaction over another. Alternatively, in some embodiments, deposition of a dielectric layer on side walls is conducted prior to the deposition of the metallic layers, thereby electrically insulating the deposited metallic layers from the elements or trenches.

Typically, a metallic layer having a thickness of about 2 nm to 50 nm is deposited on a selected surface for formation of a lead and/or for inhibition of graphene growth. In some embodiments, ALD is used to deposit a metallic layer with a thinner thickness. In some embodiments, the ALD deposition process is repeated to achieve a desired thickness. In some embodiments, a metallic layer has a height that is between 25 nm and 1000 nm, between 1 μm and 5 μm, or between 5 μm and 10 μm.

Referring back to FIGS. 4 and 14, after a metallic layer is deposited on a selected surface, step S30 is conducted to expose a portion of the metallic layer by removing a layer of materials from the patterned structure, so that the exposed portion of the metallic layer can form a contact with a subsequently grown graphene layer. As an example, FIG. 4C illustrates removing a layer from a top surface of an element, thereby exposing an upper end of a metallic layer deposited on a side wall of the respective element. For instance, a layer is removed from the top surface 204-1 of the element 104-1 thereby exposing the upper end 402-1T of the metallic layer 402-1 deposited on the left side wall of the element 104-1 and the upper end 404-1T of the metallic layer 404-1 deposited on the right side wall of the element 104-1. Removing a layer from the top surface 204-1 also produces an etched top surface 406-1. Likewise, removal of a layer from the top surface 204-2 of the element 104-2 produces an etched top surface 406-2 and exposes the upper ends 402-2T, 404-2T of the metallic layers 402-2, 404-2 deposited on the left and right side walls of the element 104-2.

Removal of a layer from the top of an element can be accomplished using any suitable etching methods disclosed in Section 7 below, including an anisotropic or a directional etching process. The exposed upper end typically has a height that is between 3 nm and 100 nm, between 100 nm and 500 nm, or between 500 nm and 1000 nm.

After exposing a portion of the metallic layer, in step S40, graphene layers are generated on desired surfaces. As illustrated in FIG. 4D, top graphene layers such as 408-1, 408-2 are generated on the etched top surfaces 406 of the elements and bottom graphene layers such as 410-1, 410-2 are generated on the bottom surfaces 206 of the trenches. In some embodiments, the generation of graphene layers on the etched top surfaces 406 and the bottom surfaces 206 occurs concurrently. In various embodiments, the top graphene layer 408-1 is generated on the entire etched top surface 406-1 and the bottom graphene layer 410-1 is generated on the entire bottom surface 206-1. The top graphene layer 408-1 contacts the upper end of the metallic layer 402-1 deposited on the left side wall of the element 104-1 at its left side 408-1L and contacts the upper end of the metallic layer 404-1 deposited on the right side wall of the element 104-1 at its right side 408-1R. Similarly, the bottom graphene layer 410-1 contacts the lower end of the metallic layer 404-1 deposited on the right side wall of the element 104-1 at its left side 410-1L and contacts the lower end of the metallic layer 402-2 deposited on the left side wall of the element 104-2 at its right side 410-1R.

In general, a bottom graphene layer has a thickness that is less than the height of the corresponding metallic layer, and a top graphene layer has a thickness that is less than the height of the exposed upper end of the corresponding metallic layer. In some embodiments, a bottom or a top graphene layer has a thickness that is between 0.3 nm and 150 nm, or comprises 1 to 500 graphene sheets. Because a metallic layer or lead is deposited before generating graphene layers and is in place during the graphene growth, each grown graphene sheet has a firm contact with the lead. As a result, the generated top and bottom graphene layers are spatially isolated and at the same time electrically connected through the deposited metallic layers or leads. The resultant graphite-based structures or devices have consistent, reliable and full contact between leads and graphene layers, thereby reducing the potential structural or functional failures that may occur if the existing methods are used for fabrication.

Generation of graphene layers on selected surfaces of a defined topography can be achieved by various methods defined in the art. Selection of a suitable method depends on the substrate material, the desired thickness of the graphene layers or other factors. For example, reverse epitaxial growth methods can be used for generating graphene layers on surfaces comprising silicon carbide or silicon implanted with carbon. The basic epitaxial growth process involves heating the substrate, after exposing a portion of a lead, to elevated temperatures, for example 900° C. to 1300° C. or in some case to 1700° C., in a vacuum or in a controlled inert environment, to spur the growth of graphene.

When heated to elevated temperatures, in some embodiments, thermal decomposition occurs in the substrate. Silicon migrates to the surface and evaporates, leaving carbon at or near the surface for epitaxial growth of graphene. Controlling parameters for graphene growth include pressure, temperature, and processing time. In some embodiments, heating the substrate is conducted in a furnace with quenching, or by rapid thermal annealing with a pulsed source. If selected surfaces of the topography comprise metallic materials such as copper, nickel, iridium, or cobalt, chemical vapor deposition (CVD) techniques can be used for graphene growth. CVD techniques make use of a high temperature furnace to deposit atoms on the substrate or on selected surfaces of the substrate. More information on graphene growth techniques that can be used in accordance with the present disclosure can be found, for example, in "Graphene Growth Techniques for Use in Nanoelectronics," last accessed on Dec. 6, 2012 from cerc.utexas.edu/~kparrish/class/Graphene$_{13}$ Synthesis.pdf, and in "Temperature Dependent Growth Properties of Epitaxial Graphene on Carbon-Face Silicon Carbide," pp 98-99, 2010 NNIN REU Research Accomplishments, and copending U.S. Patent Provisional Application No. 61/745,464, each of which is hereby incorporated herein in its entirety by reference.

Referring still to FIG. 14, in some embodiments, the exemplary method 1400 in accordance with the present disclosure includes additional, optional, or alternative processes. For example, in some embodiments, the exemplary method 1400 includes an additional or optional step S50 for selectively depositing a graphene generation material on a selected surface or surfaces, for example, when the substrate is made of a dielectric material. Deposition of the graphene generation material is conducted subsequently to the exposure of a portion of a lead but prior to the generation of graphene layers.

Figure 7:
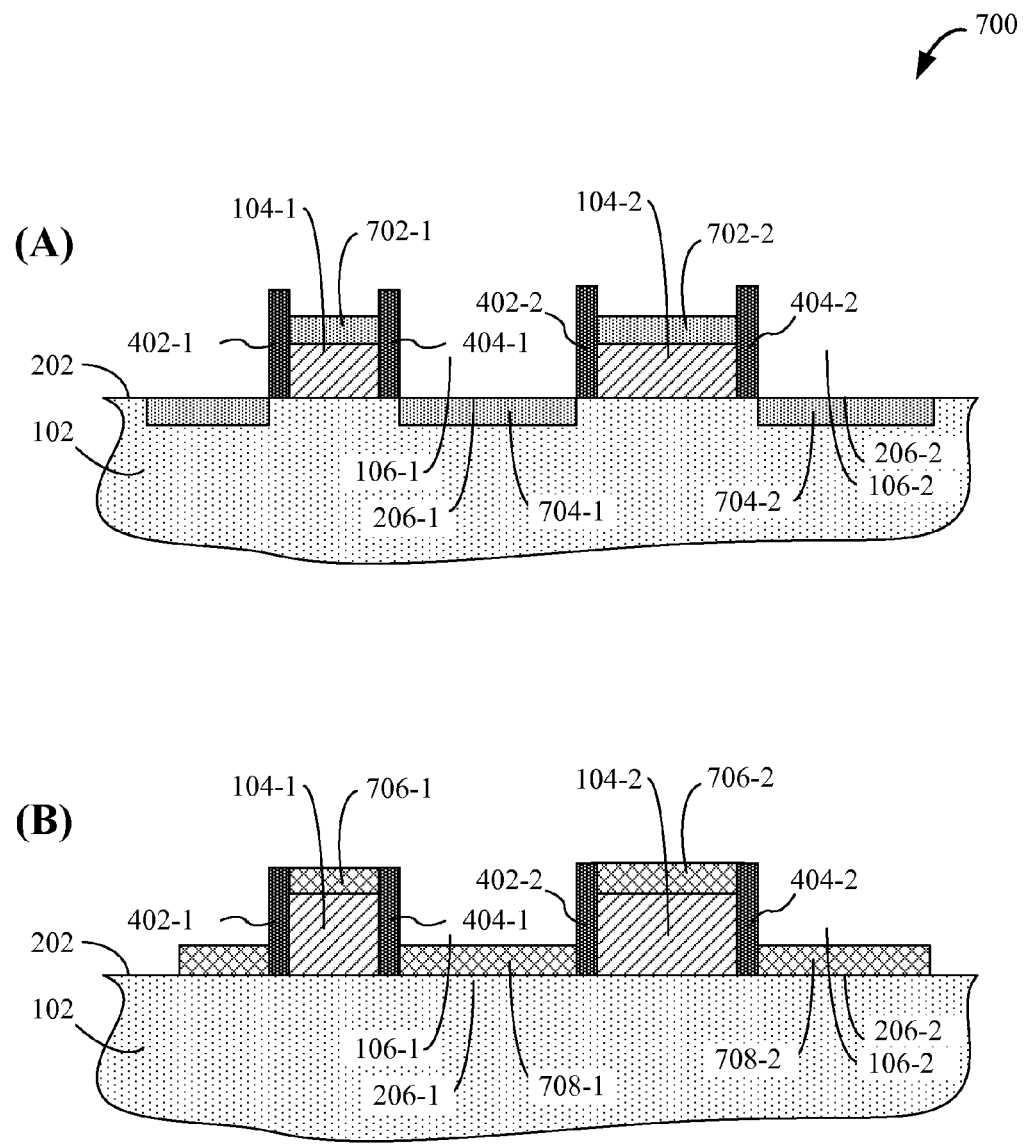
FIG. 7A illustrates an optional or additional doping process for producing a carbide layer at a selected surface of a defined topography in accordance with an embodiment of the present disclosure.
FIG. 7B illustrates an optional or additional deposition process for depositing a graphene generation material on a selected surface of a defined topography in accordance with an embodiment of the present disclosure.

As an example, FIG. 7B illustrates selective deposition of a graphene generation material on the etched tops of the elements, indicated by 706-1, 706-2, and on the bottoms of the trenches, indicated by 708-1, 708-2. In some embodiments, the deposition of the graphene generation material on the etched tops of the elements and the bottoms of the trenches is conducted concurrently. Various deposition methods disclosed in Section 6 below can be used to deposit the graphene generation material, such as by using a spin-on-glass process or a diluted solution. Suitable graphene generation materials include, but not limited to, silicon (Si), silicon carbide (SiC), germanium (Ge), boron nitride (BN), and molybdenum sulfide (MoS).

Continuing to refer to FIG. 14, in some embodiments, the exemplary method 1400 in accordance with the present disclosure includes an additional or optional step S60 that selectively dopes the patterned topography with carbon to form a carbide layer near the selected surface or surfaces. In various embodiments, step S60 is conducted prior to the generation of graphene layers S40 but subsequent to the exposure of a portion of a lead S30 or to the deposition of a graphene generation material S50. In some embodiments, step S50 is achieved by various methods including ion implantation and/or chemical vapor deposition. The substrate used for this process can be made of silicon or germanium, or other materials such as compound semiconductors, oxides, nitrides, carbides, metals or metal alloy.

As an example, FIG. 7A illustrates doping a defined topography with carbon using an ion implantation method. Ion implantation is a materials engineering process that can be used to change the physical, chemical, or electrical properties of the target such as the substrate 102. During ion implantation, ions (e.g., charged atoms or molecules) are created via an enormous electric field stripping away an electron. These ions are filtered and accelerated toward the target, and buried in the target. The depth of the implantation depends on the acceleration energy (e.g., voltage). The ions alter the elemental composition of the target if the ions differ in composition from the target. They can also change physical, chemical or electrical properties of the target by transferring their energy and momentum to the electrons and atomic nuclei of the target material. For example, they can change the crystal structure of the target by the energetic collision cascades.

As shown in FIG. 7A, directional ion implantation with carbon is performed on an exemplary patterned structure having a plurality of elements such as 104-1, 104-2 and trenches such as 106-1, 106-2. Such directional ion implantation produces carbide layers in the substrate 102 within the surfaces 204 of the elements 104 and within the surfaces 206 of the trenches 106. For example, a carbide layer 702-1 is produced at or near the surface 204-1 of the element 104-1 and a carbide layer 704-1 is produced at or near the surface 206-1 of the trench 106-1. In some embodiments, doping the substrate with carbon comprises ion implantation to the entire surface 204-1 of the element 104-1 or the entire surface 206-1 of the trench 106-1 with elemental carbon.

In various embodiments, the ion implantation is performed with a dose between $10^8$ ions/cm$^2$ and $10^{21}$ ions/cm$^2$, and an energy between 5 KeV and 400 KeV. By controlling the implantation dose or energy, the ion implantation controls the carbon penetration into the selected surfaces, thus controlling the carbon concentration or profile at or near the selected surfaces. As a result, the ion implantation provides an accurate control of the thickness of the subsequently generated graphene layers. More information on doping the patterned structures with carbon can be found, for example, in a copending U.S. Patent Provisional Application No. 61/745,464, the entire content of which is incorporated herein by reference.

In some embodiments, the exemplary method 1400 in accordance with the present disclosure includes an additional or optional step S70, in which the substrate is selectively doped with one or more dopants to produce an integrated graphite-based structure with a barrier, a junction, a connector, or an insulator. The doping step S70 can be conducted either prior to or after graphene generation, using ion implantation or various other methods. More information on doping processes, suitable dopants and doped structures can be found, for example, in a copending U.S. Patent Provisional Application No. 61/745,464, the entire content of which is incorporated herein by reference.

The additional, alternative, or optional steps described above can be conducted either separately or in combination with each other, as shown in FIG. 14. One of ordinary skill in the art will appreciate that the order of performing these processes or steps shown in FIG. 14 is illustrative. Depending on the application, the substrate materials, or other factors, the additional or optional processes employed and the order of performing such processes can be readily varied.

Figure 9:
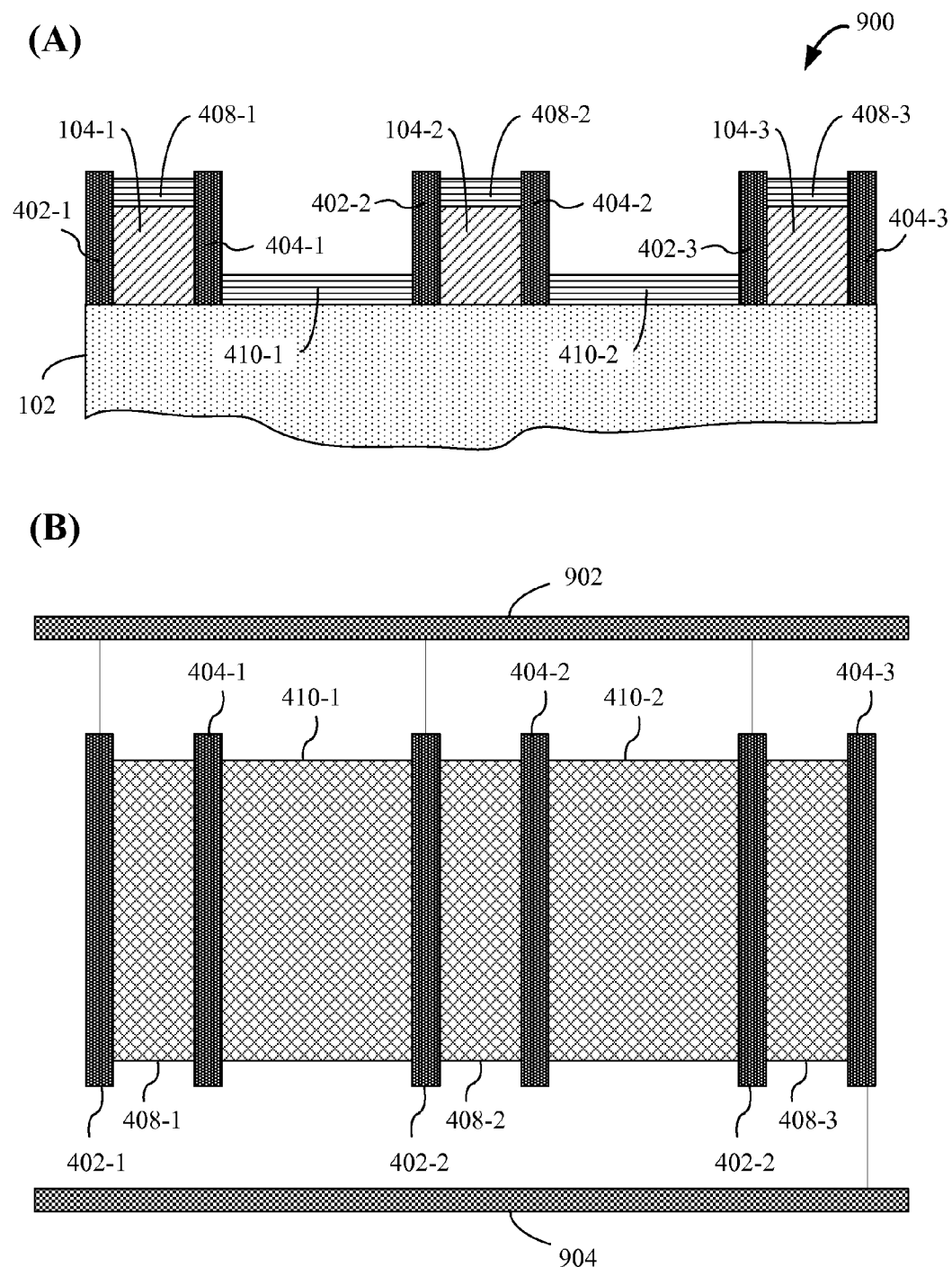
FIGS. 9A-9B illustrate an exemplary electrically-connected graphene device topography in accordance with an embodiment of the present disclosure.

Turning now to FIG. 9, there is depicted an exemplary integrated graphite-based device 900 fabricated by the exemplary methods of the present disclosure. FIG. 9A is a cross-sectional view and FIG. 9B is a top view of exemplary integrated graphite-based device 900. As shown in FIG. 9A, graphene layers generated on etched top surfaces of the elements such as 408-1, 408-2 and 408-3 are spatially, e.g. vertically, separated from graphene layers generated on bottom surfaces of corresponding trenches such as 410-1 and 410-2. Advantageously, such spatially separated graphene layers are electrically connected to one another through the metallic layers or leads. For example, the graphene layer 410-1 is in electrical communication with the graphene layer 408-1 through the lead 404-1 that is deposited on the right side wall of the element 104-1, and is in electrical communication with the graphene layer 408-2 through the lead 402-2 that is deposited on the left side wall of the element 104-2.

In addition, by way of illustration, the top graphene layers 408-1, 408-2 and 408-3 in FIG. 9 have a first set of characteristic dimensions and the bottom graphene layer 410-1 and 410-2 have a second set of characteristic dimensions that respectively facilitate absorption or emission of photons in two different wavelength ranges. For example, the top graphene layers 408-1, 408-2 and 408-3 absorb or emit a blue frequency or blue frequency range while the bottom graphene layer 410-1 and 410-2 absorb or emit a green frequency or green frequency range.

With the leads in place, the graphene layers in the integrated graphite-based device can be electrically coupled in various ways to achieve desired functionalities or produce different outputs. The electrical coupling can be either individually or collectively, in series or parallel. As an example, FIG. 9B depicts electrically connecting the leads deposited on left walls of the elements such as 402-1, 402-2 and 402-3 to a common bus 902 and electrically connecting the leads deposited on right side walls of the elements such as 404-1, 404-2, and 404-3 to another common bus 904. The common buses 902, 904 can then be electrically coupled to an external circuit or other sources. Electrically coupled in such a manner, the integrated graphite-based device 900 can absorb or emit both blue and green frequencies or frequency ranges concurrently. This capability has many advantages where absorption or emission of photons in a wide wavelength range is of interest. Examples include fabrication of photovoltaic devices for absorption of solar light.

Figure 10:
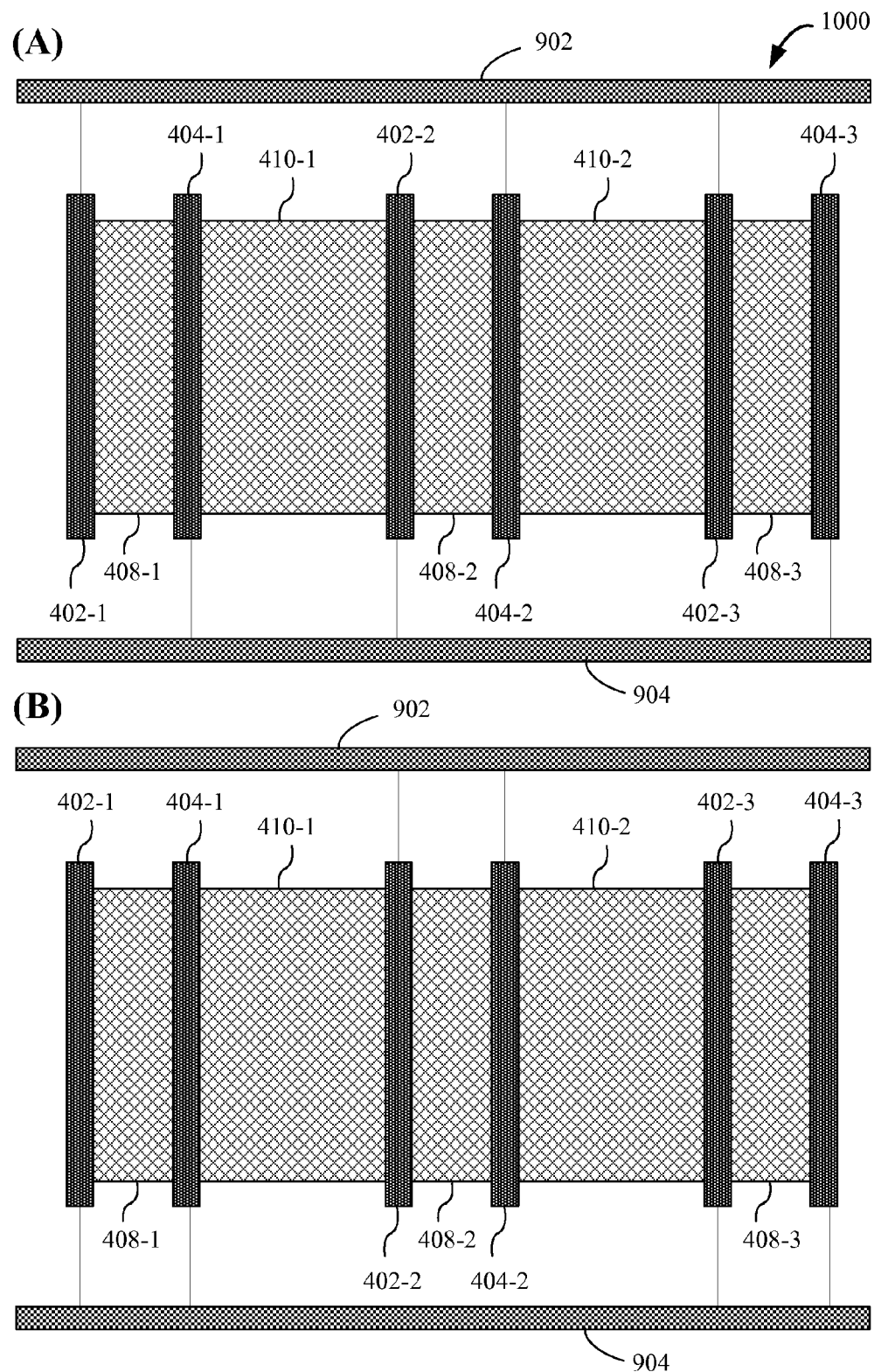
FIGS. 10A-10B illustrate another exemplary electrically-connected graphene device topography in accordance with an embodiment of the present disclosure.
Figure 11:
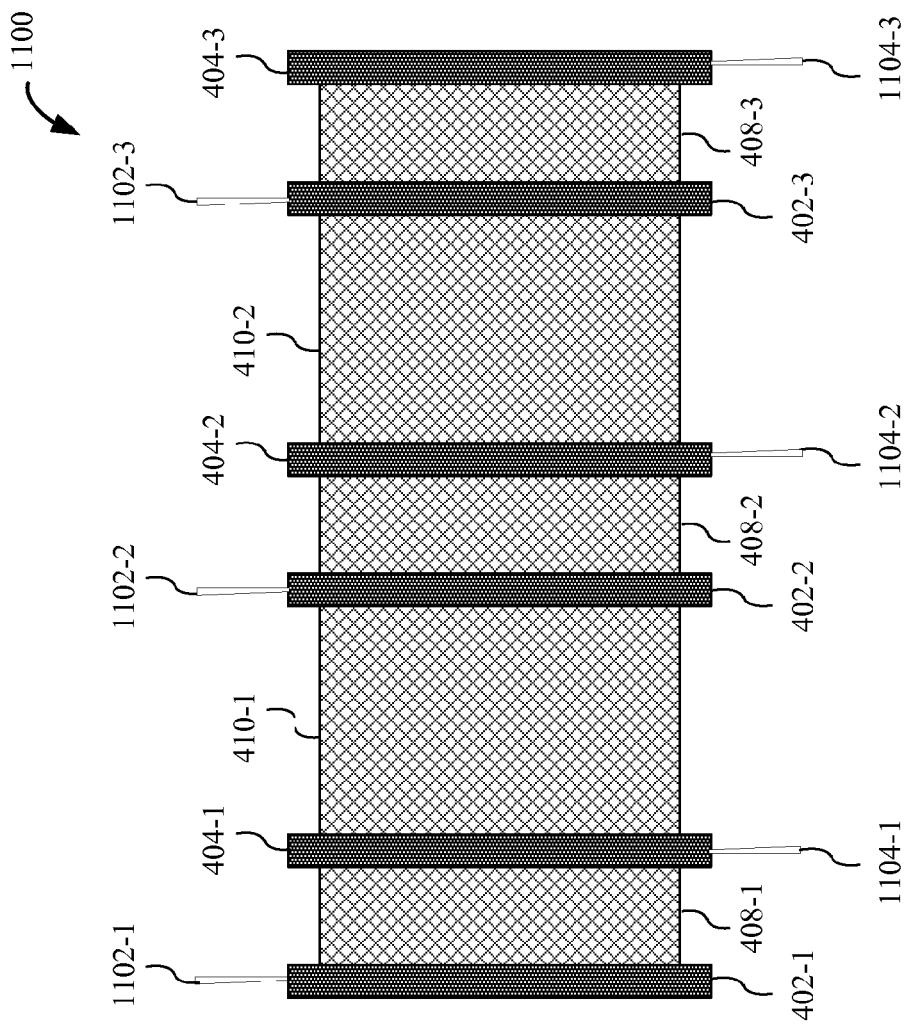
FIG. 11 illustrates yet another exemplary electrically-connected graphene device topography in accordance with an embodiment of the present disclosure.
Figure 12:
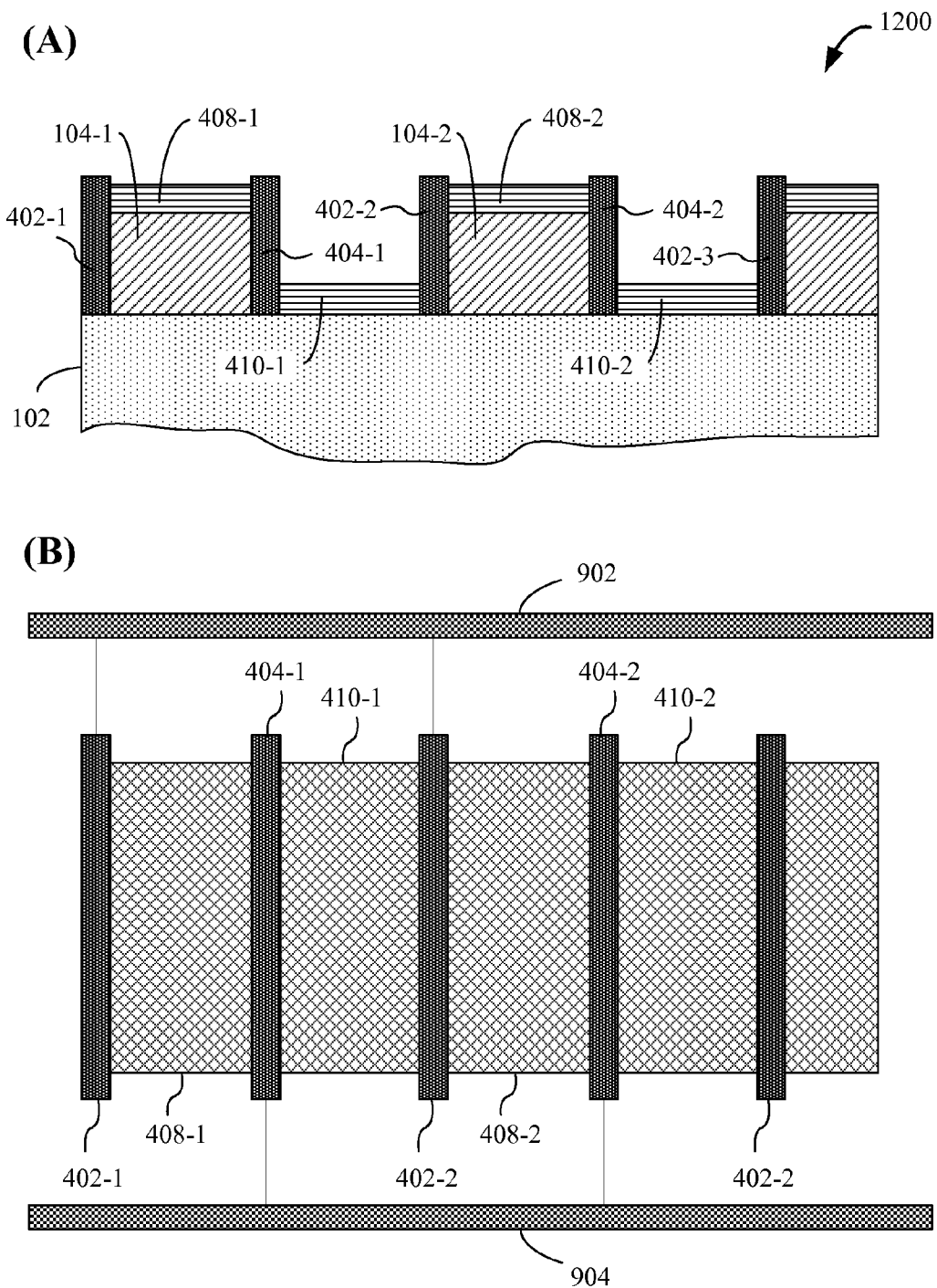
FIGS. 12A-12B illustrate still another exemplary electrically-connected graphene device topography in accordance with an embodiment of the present disclosure.

To achieve different functionalities or produce different outputs, the exemplary embodiment depicted in FIG. 9A can be wired differently. For example, by connecting some leads deposited on left side walls and some leads on right side walls to a common bus, the integrated graphite-based device 900 can absorb or emit photon in a specific wavelength range, e.g. only blue frequency or frequency range or only a green frequency or frequency range. FIGS. 10 A and 10B illustrate two examples.

In FIG. 10 A, leads 402-1, 404-2 and 402-3 are electrically connect to a common bus while leads 404-1, 402-2 and 404-3 are electrically connected to another common bus. Because the leads 404-1, 402-2 on both sides of the bottom graphene layer 410-1 are electrically connected to the same common bus 904, there is no electrical potential within the graphene layer 410-1. Consequently, an integrated graphite-based device wired in such a manner as depicted in FIG. 10A can only absorb or emit photons targeted by the top graphene layers such as 408-1, 408-2 and 408-3, e.g. a blue frequency or blue frequency range.

Similarly, in FIG. 10B, the top graphene layers such as 408-1, 408-2 and 408-3 will not capture the reaction. Consequently, an integrated graphite-based device wired in such a manner as depicted in FIG. 10B can only productively absorb or emit photons targeted by the bottom graphene layers such as 410-1 and 410-2, e.g. green frequency or green frequency range.

Other than a common bus, various other means can be used to electrically connecting the leads. For example, using metallic pads or connectors as indicated by 1102 and 1104 in FIG. 11. Depending on the application and desired functionality, the individual pad or connector such as 1102-1, 1104-1 can then be connected to other individual pad or connector such as 1102-2, 1104-2, to an external circuit or to other sources.

5.3. Advantages

There are many advantages to fabricating graphene device topographies in the manner described herein. One advantage is ease of fabrication. Currently, the existing methods typically deposit leads after the graphene growth. Formation of lead connection with graphene layers require patterning graphene sheets into desired shapes, and processing graphene is a difficult task due to the novelty of graphene and the techniques of etching the same. The methods of the present disclosure, however, deposit leads before the graphene generation, thus eliminating graphene processing required by the existing methods and several additional processes such as adhesion and diffusion processes. In addition, patterning other materials, for example, dielectric, semiconducting or metallic materials, to form a desired topography is a much more mature technology and can be achieved with much more ease.

Another advantage of the methods described in the present disclosure is the ability to produce structures and devices with consistent and reliable interconnections between the leads and the graphene layers. Because leads are deposited after the graphene growth, a lead formed using the existing methods is usually not in full contact with all of the graphene sheets within a graphene layer, thus imposing potential structural or functional failures of the devices. Using the methods of the present disclosure, however, the leads are in place before the graphene generation, thus producing a lead in full contact with each graphene sheet. In addition, the methods of the present disclosure have the ability to control the configuration of the lead contact, including shape, size and position.

Still another advantage of the methods described in the present disclosure is the ability to produce structures and devices with improved functionalities. For example, the methods of the present disclosure can form leads in a substantially vertical direction instead of horizontal direction. Such vertical leads can connect graphene layers with very shorter widths, such as 5 nm, but very long lengths, such as 10 cm. As a result, the methods of the present disclosure can produce structures and devices with large functional surface areas while minimizing the photon or electron recombination, thereby improving the functionalities such as efficiency of the devices. In addition, by elimination of post graphene processing, the methods of the present disclosure also reduce or eliminate the loss in the functional graphene surfaces.

Because the leads are deposited before the graphene generation, the methods of the present disclosure have many other advantages. For example, the leads can be configured to match the geometries or desired functionalities. The leads can also be configured to connect different types of graphene layers or structures, such as connecting a narrow graphene layer generated on the top surface of an element with a wider graphene layer generated on the bottom surface of a trench, or connecting a boron doped graphene layer generated on the top surface of an element with a non-doped graphene layer generated on the bottom surface of a trench.

6. DEPOSITION METHODS

The following subsections describe individual fabrication techniques that can be used to deposit material, e.g. element 104, metallic layer 402, 404, and graphene generation material 706, hereinafter referred to collectively as "deposit materials," in accordance with embodiments of the present disclosure.

6.1. Chemical Vapor Deposition

In some embodiments, one or more layers of the deposit materials are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

6.2. Reduced Pressure Chemical Vapor Deposition

In some embodiments, one or more layers of the deposit materials are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

6.3. Low Pressure Chemical Vapor Deposition

In some embodiments, one or more layers of the deposit materials are deposited by low pressure chemical vapor deposition (LPCVD) or very low pressure CVD. LPCVD is typically performed at below 1 Pa.

6.4. Atmospheric Chemical Vapor Deposition

In some embodiments, one or more layers of the deposit materials are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

6.5. Plasma Enhanced Chemical Vapor Deposition

In some embodiments, one or more layers of the deposit materials are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

6.6. Anodization

In some embodiments, one or more layers of the deposit materials are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, J. Electrochem. Soc. 129, pp. 2749-2752, which is hereby incorporated by reference in its entirety.

6.7. Sol-gel Deposition Techniques

In some embodiments, one or more layers of the deposit materials are deposited by a sol-gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low-temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

In the semiconductor industry the sol-gel method described is often used to deposit silicon dioxide. The method is known as the Spin-On Glass method (SOG). Spin-On Glass materials have been widely used as a diffusion source or a planarizing dielectric or multilevel metalization schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, *Spin-On Glass Materials and Applications* in Advanced IC Technologies, 1999, which is hereby incorporated herein by reference in its entirety.

6.8. Plasma Spraying Techniques

In some embodiments, one or more layers of the deposit materials are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet reaches temperatures of 20,000 K and velocities up to 1000 $ms^{-1}$ in some embodiments. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, *Fundamentals of Microfabrication*, Second Edition, 2002, pp. 157-159, CRC Press, which is hereby incorporated by reference in its entirety.

6.9. Ink Jet Printing

In some embodiments, one or more layers of the deposit materials are deposited by ink jet printing. Ink jet printing is based on the same principles of commercial ink-jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of a deposit material. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink jet head is used for ink jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present disclosure, an epoxy delivery system is used to deposit a layer of a device. An example of an epoxy delivery system is the Ivek Digispense 2000 (Ivek Corporation, North Springfield, Vt.). For more information on jet spraying, see, for example, Madou, *Fundamentals of Microfabrication*, Second Edition, 2002, pp. 164-167, CRC Press, which is hereby incorporated by reference herein in its entirety.

6.10. Vacuum Evaporation

In one embodiment of the present disclosure, one or more layers of the deposit materials are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, *Microchip Fabrication*, Fourth Edition, McGraw-Hill, New York, 2000, pp. 407-411, which is hereby incorporated by reference herein in its entirety.

6.11. Sputter Deposition/Physical Vapor Deposition

In another embodiment of the present disclosure, one or more layers of the deposit materials are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, *Microchip Fabrication*, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as I33 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

6.12. Collimated Sputtering

In another embodiment of the present disclosure, one or more layers of the deposit materials are deposited by collimated sputtering. Collimated sputtering is a sputtering process where the arrival of metal occurs at an angel normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

6.13. Laser Ablated Deposition

In another embodiment of the present disclosure, one or more layers of the deposit materials are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

6.14. Molecular Beam Deposition

In another embodiment of the present disclosure, one or more layers of the deposit materials are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

6.15. Ionized Physical Vapor Deposition

In another embodiment of the present disclosure, one or more layers of the deposit materials are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

6.16. Ion Beam Deposition

In another embodiment of the present disclosure, one or more layers of the deposit materials are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately $10^{-4}$ Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

6.17. Atomic Layer Deposition

In another embodiment of the present disclosure, one or more layers of the deposit materials are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

6.18. Hot Filament Chemical Vapor Deposition

In another embodiment of the present disclosure, one or more layers of the deposit materials are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

6.19. Screen Printing

In another embodiment of the present disclosure, one or more layers of the deposit materials are deposited by a screen printing (also known as silk-screening) process. A paste or ink is pressed onto portions of an underlying structure through openings in the emulsion on a screen. See, for example, Lambrechts and Sansen, *Biosensors: Microelectrochemical Devices*, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µM holes) and a typical paste, a lateral resolution of 100 µM can be obtained.

For difficult-to-print pastes, a shadow mask, such as a thin metal foil with openings, complements the process. However, the resolution of this method is inferior (>500 µM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µM to 50 µM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, *Fundamentals of Microfabrication*, Second Edition, CRC Press, Boca Raton, Fla., 2002, pp. 154-156, which is hereby incorporated by reference herein in its entirety.

6.20. Electroless Metal Deposition

In another embodiment of the present disclosure, one or more layers of the deposit materials are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, *Fundamentals of Microfabrication*, Second Edition, CRC Press, Boca Raton, Fla., 2002, pp. 344-345, which is hereby incorporated by reference herein in its entirety.

6.21. Electroplating

In another embodiment of the present disclosure, one or more layers of the deposit materials are deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

7. LITHOGRAPHIC ETCHING METHODS

The following subsections describe lithographic etching techniques that can be used in the fabrication methods described above. One of skill in the art will appreciate that etching or patterning the substrate can be conducted using other methods including, but not limited to, direct write technologies, Block Copolymer techniques and frequency doubling techniques.

7.1. Cleaning and Dehydration Baking

In some embodiments in accordance with the present disclosure, the fabrication methods begin with a cleaning process. Substrate cleaning is an important step in a lithographic process if there is contamination in presence, as the contamination can severally compromise the adhesion of the resist to the substrate. Substrate surfaces have four general types of contamination: particulates, organic residues, inorganic residues, and unwanted oxide layers. Depending on the substrate and the type of contaminants, several cleaning techniques can be used. These methods include dry cleaning, wet cleanings, ultrasonic agitation, polishing with abrasive compounds, supercritical cleaning In some embodiments, a wet cleaning is used to remove organic materials from the substrate and prepare for the adhesion of the resist to the substrate. It is carried out by submerging a substrate in a bath or by rinsing the substrate with DI water and/or a solvent rinse. After the wet cleaning, the substrate is dried to remove moistures. Several drying techniques can be used. For example, in some embodiments, the substrate after wet cleaning can be dried using dehydration bake method. In this method, the substrate is baked at a temperature for a period of time such as baked at 80° C. for several minutes. In some embodiments, the substrate may be dried by $N_2$ flow or spinning. More detailed information with regard to cleaning and drying of a substrate can be found, for example, in Van Zant, Microchip Fabrication, Forth Edition, McGraw-Hill, New York, 2000, pp. 87-131, which is hereby incorporated by reference herein in its entirety.

7.2. Adhesion Promotion Coating

To further improve the adhesion of the resist to the substrate, an adhesion promoter can be applied to the substrate before the application of the resist. Depending on the substrate and the resist, various adhesion promoters can be used. In some embodiments, Bis(trimethylsilyl)amine (also known as hexamethyldisilazane, or HMDS) or other organic materials are chosen as the adhesion promoter for the fabrication processes described in the present application.

HMDS is an organosilicon compound with the molecular formula $[(CH_3)_3Si]_2NH$. The molecule is a derivative of ammonia with trimethylsilyl groups in place of two hydrogen atoms. This colorless liquid is a reagent and a precursor to bases that are popular in organic synthesis and organometallic chemistry. In photolithography, HMDS is often used as an adhesion promoter for photoresist, and can be applied using any suitable conventional methods. For example, HMDS can be applied by vapor chemical deposition. In general, good adhesions are obtained by applying HMDS from the gas phase on heated substrates.

7.3. Bottom Anti-reflective Coating

Optionally, a bottom anti-reflective coating (BARC) may be applied to help reduce image distortions associated with light reflections during lithography. In some cases, BARCs are critical and highly desirable. For example, when the substrate or a layer on the substrate is highly reflective, as in metal and polysilicon layers, light reflections can destroy the pattern resolution by three mechanisms: a) off-normal incident light can be reflected back through the resist that is intended to be masked; b) incident light can be reflected off device features and expose "notches" in the resist; and c) thin-film interference effects can lead to linewidth variations when resist thickness changes are caused by substrate or wafer topology or nonflatness.

BARCs can be either organic or inorganic, and can be applied either before or after the photoresist. Conventional methods, such as spinning, sputtering or chemical vapor deposition, can be used to apply the BARCs. By reducing standing waves, thin-film interference, or specular reflections, a BARC helps shrink line widths and improves the pattern resolution. In some cases, a BARC can absorb the radiation and dissipates the energy as heat. Such a BARC is generally suitable to be applied to a substrate before the resist. This BARC lowers reflectance back into the photoresist that has passed through the photoresist.

7.4. Resist Properties

One form of photolithographic processing in accordance with the present disclosure begins with the coating of a resist layer over the layer of material to be patterned. Another form of photolithographic processing in accordance with the present disclosure applys the resist coating after at least one of the steps described in the previous sections, i.e., cleaning and dehydration baking, adhesion promotion coating or BARC. Resists used to form this resist layer are typically comprised of organic polymers applied from a solution. In some embodiments, the thickness of the resist is determined using Bossung Curve analysis. Bossung Curve analysis is one of the most commonly used tools in lithography. It maps a control surface for critical dimensions as a function of the variables of focus and exposure (dose). A detailed discussion of the Bossung Curve analysis can be found in Zavecz, Metrology, Inspection and Process Control edited by C. Archie, Proceeding of SPIE (2006) Vol. 6152-109.

In some embodiments, this resist layer has a thickness in the range of 0.1 µm to 2.0 µm. Furthermore, in some embodiments, the resist layer has a uniformity of plus or minus 0.01 µm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, Microchip Fabrication, Forth Edition, McGraw-Hill, New York, 2000, pp. 217-222, which is hereby incorporated by reference herein in its entirety.

Negative Resists. In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethylmethacrylate (PMMA), polymethylisopropyl ketone (PMIPK), poly-butene-1-sulfone (PBS), poly-(trifluoroethyl chloroacrylate) TFECA, copolymer-(V-cyano ethyl acrylate-V-amido ethyl acrylate) (COP), poly-(2-methyl pentene-1-sulfone) (PMPS) and the like.

Positive resists. In other embodiments, the resist layer (e.g., positive resist layer of FIG. 2A) is a positive resist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR 1A, LOR 3A, or LOR 5A (MICROCHEM, Newton, Mass.). LOR lift-off resists use polydimethylglutarimide.

7.5. Soft Baking

After the resist layer has been applied, the density is often insufficient to support later processing. And some solvent may inhibit the exposure curve. Accordingly, in some embodiments of the present disclosure, a bake is used to densify the resist layer and drive off residual solvent or excess carrier solvent from the resist layer. After the bake, the resist becomes less tacky and the thickness of the resist layer is reduced slightly. This bake is referred to as a softbake, prebake, or post-apply bake. Several methods of baking the resist layer are contemplated by the present disclosure including, but not limited to, convection ovens, infrared ovens, microwave ovens, or hot plates. See, e.g, Levinson, Principles of Lithography, SPIE Press, Bellingham, Wash., 2001, pp. 68-70, which is hereby incorporated by reference herein in its entirety.

7.6. Alignment and Exposure of the Mask

After the spacer has been coated with a resist layer, the next step is alignment and exposure of the resist layer. Alignment and exposure is, as the name implies, a two-purpose photomasking step. The first part of the alignment and exposure step is the positioning or alignment of the required image on the material surface. The image is found on a mask. The second part is the encoding of the image in the resist layer from an exposing light or radiation source. In the present disclosure, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present disclosure, see, e.g., Solid State Technology, April 1993, p. 26; and Van Zant, Microchip Fabrication, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present disclosure are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments, electron or optical beam writers are used to pattern negative masks or positive masks. See, e.g., Levison, Principles of Lithography, SPIE Press, Bellingham, Wash., 200 1, pp. 229-256, which is hereby incorporated by reference herein in its entirety.

Exposing the resist to light breaks or forms chemical bonds in the resist layer. The final image matches the desired pattern from the mask or interference pattern. In various embodiments, attention is focused on providing uniformity of the light intensity and/or controlling the exposure rate.

In one embodiment of the present disclosure, the tool used to project the pattern of a mask onto a device is a wafer stepper. Wafer steppers exist in two configurations, step-and-repeat and step-and-scan. In a step-and-repeat system, the entire area of the mask to be exposed is illuminated when a shutter is opened. In a step- and scan system, only part of the mask, and therefore only part of the exposure field on the device unit, is exposed when a shutter is opened. The entire field is exposed by scanning mask and the device being patterned synchronously. See, e.g., Levison, Principles of Lithography, SPIE Press, Bellingham, Wash., 200 1, pp. 1 33-174, which is hereby incorporated by reference herein in its entirety.

7.7. Post Expose Bake

Before developing the resist, a post exposure bake (PEB) is optionally performed after exposure. In some cases where high resolutions are not required, the PEB is not necessary. However, for certain resists or for high resolutions, a PEB is inevitable for the crosslinking induced by the exposure.

PEB can be applied above the softening point of the resist without destroying the structures to be developed. For example, a PEB can be performed at 110° C., for 1-2 min on a hotplate. A PEB performed near the softening point of the photo resist can reduce mechanical stress formed during softbake and exposure. A PEB can also promote the thermally activated diffusion of carboxylic acid formed during exposure from the photo active compound. This diffusion step smoothes the spatial periodic pattern of carboxylic acid, which in turn will help to improve the image or pattern resolution.

7.8. Development

After exposure through a mask, the pattern is coded as a latent image in resist as regions of exposed and unexposed resist. The pattern is developed in the resist by chemical dissolution of the unpolymerized resist regions. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for many negative-resist-developing situations is xylene or Stoddart solvent. The development step is done with a chemical developer followed by a rinse. For negative resists, the rinse chemical is n-butyl acetate in some embodiments.

Positive resists present a different developing condition. The two regions, polymerized and unpolymerized, have a different dissolving rate. This means that during the developing step some resist is always lost from the polymerized region. Use of developers that are too aggressive or that have overly long developing times result in an unacceptable thinning of the resist. Two types of chemical developers used with positive resists in accordance with the present disclosure are alkaline-water solutions and nonionic solutions. The alkaline-water solutions can be sodium hydroxide or potassium hydroxide. Typical nonionic solutions include, but are not limited to, tetramethylammonium hydroxide (TMAH). The rinse chemical for positive-resist developers is water. A rinse is used for both positive and negative resists. This rinse is used to rapidly dilute the developer chemical to stop the developing action.

There are several methods in which a developer is applied to resist in order to develop the latent image. Such methods include, but are not limited to, immersion, spray development, and puddle development. In some embodiments of the present disclosure, wet development methods are not used. Rather, a dry (or plasma) development is used. In such dry processes, a plasma etcher uses energized ions to chemically dissolve away either exposed or unexposed portions of the resist layer without first developing the resist layer using wet chemical techniques.

In some embodiments, in particular when an organic compound is used as the photoresist, the chemical reaction in the resist layer needs to be controlled to ensure the image fidelity. This can be achieved by controlling the exposure time, the development time, or other processing parameters. Image fidelity herein refers to the ability of a lithographic process to render an image accurately, without any visible distortion or information loss.

7.9. Hard Baking

In some embodiments of the present disclosure, resist is hard baked after it has been developed. The purpose of the hard bake is to achieve good adhesion of the resist layer to the underlying layer to be patterned. In some embodiments, a hard bake is accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Usually the hard baking temperature is the hottest or highest temperature among all of the processes. Nominal hard bake temperatures are from 130° C. to 200° C. for thirty minutes in a convection oven. The hard baking sets the resist and enhances mechanical stability of the resist for the subsequent etch or implant process. At this point, the image fidelity is usually measured and fed back to the preceding lithographic steps.

7.10. Etching

After development, an etching step is used for patterning. A number of etching methods are available. Etching can be divided into dry and wet etching. The following disclosure provides examples of such etching. It will be understood by one of skill in the art that the disclosed etching methods can be used independently of the preceding lithographic steps in accordance with some embodiments. It will be further understood by one of skill in the art that the disclosed etching methods can be used with the preceding lithographic steps in accordance with some embodiments. Wet etching is the use of acidic or basic solutions to solvate away a specific reacted species. Examples are silicon dioxide being etched in hydrofluoric acid, or $Si_3N_4$ in hot phosphoric acid, or mono-crystalline silicon in potassium hydroxide (KOH)). Photoresist materials are removed by acid or base materials (depending on polarity and resist chemistry).

The following list is a generic categorization of the classifications of etches methods. Each etch method has specialized equipment for optimization of the process. Complexity has evolved to the point where some of the terms and techniques are interchangeable. For example, there are terms depending on the vendor, for inductive coupled plasma (ICP) etch or transformer coupled plasma (TCP), each which improves an ion etcher.

7.10.1 Wet Etching.

In wet etching, etchant is introduced either as a liquid bath with submersion or a surface spray/mist. Material is removed as a function of solvation of the etch intermediate or byproduct. A limitation of wet etching is the wetting function of the chemical. Some etchants are two step reactions such as oxidation of a material then solvation of the oxide.

Wet etches can also be used in combination with the dry etches as a preparatory step for surface cleaning or contaminate removal. An example is organic material removal prior to a reactive ion etch. Wet etches are isotropic or follow crystal lattices.

In one embodiment of the present disclosure, the structure to be patterned is immersed in a tank of an etchant for a specific time. Then the structure is transferred to a rinse station for acid removal, and transferred to a station for final rinse and a spin dry step.

Wet Spray Etching or Vapor Etching. In some embodiments of the present disclosure, wet spray etching or vapor etching is used for patterning. Wet spray etching offers several advantages over immersion etching including the added definition gained from the mechanical pressure of the spray. In vapor etching, the wafer is exposed to etchant vapors such as hydroflowic acid vapors.

7.10.2 Dry Etching—Reactive-ion Etching

Dry etching encompasses other methods outside the wet etch environment. Basic mechanics includes excitation of a chemical to an ionic state and then reaction with the substrate and films. Material is removed either by physical/mechanical methods or chemical conversion and solvation into the gas stream.

Sputter (Physical/Mechanical). In sputter approaches, ions or elements are accelerated to a high energy and directed toward a surface. Surfaces are removed due to the collisions of these highly charged ions, much like a nanoscale sandblasting method. Sputter etching is facilitated by charging the ion and then establishing a high bias towards to the substrate. Removal is line of sight from the target in the direction of the bias. Sputter etching is a method to achieve anisotropic etch profiles. Sputtering can also be accomplished by directional ion bombardment by 'ion guns'. Examples include focused ion beam (FIB) or other direct write approaches.

Chemical (Solvation—Liquid or Gas). Chemical enhanced etching exploits generation of intermediate species that can be solvated in the solution or vaporized in the low pressure chamber. Chemical etching is tuned to generate the solvated states due to the chemicals included in the reaction mixture. For example, chlorine is used for most metals. A fluorine based chemical such as carbontetrafluoride (CF4) or sulfurfluoride (SF6) is used for etching silicon or silicon oxide. Oxide etches with CF4 aor SF6 follows the same reaction mechanism as the wet etch with HF acid.

Chemical etch is more isotropic in nature than the corresponding sputtering systems. A technique of alternating and combining the two methods can sculpt complex side wall profiles. The present disclose encompasses the use of such methods to generate the specific nodes for functionality. An example is the 'wine glass' structure disclosed FIG. 7 of related application No. 61/802,006, filed Mar. 15, 2013, which is hereby incorporated by reference herein for its disclosure of such structures.

Ion Beam Etching. Another type of etcher that is used to perform the etching of spacer 140 in accordance with various aspects of the present disclosure is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

Plasma Etching. Plasma generation is a method for ionization in the dry etch process. Plasmas can be tuned and controlled for the different gases used. Plasma can be struck with one gas and maintained by another. Relative location of the plasma can increase etch rate or impact resultant damage. Some systems apply remote plasma generation sources while others control the confinement and immersion in the plasma. Generally there is a dilution or carrier gas that maintains the plasma and then a small volume of reactive gas is introduced. Vacuum levels define the type of plasma etching and complexity for control. Power of the generator is a control factor as well as the frequency.

In some embodiments, plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually CF4 that is mixed with oxygen. A power supply creates a radio frequency (RF) field through electrodes in the chamber. The field energizes the gas mixture to a plasma state. In the energized state, the fluorine attacks the silicon dioxide, converting it into volatile components that are removed from the system by the vacuum system.

Any of a wide variety of plasma etchers is used to perform etching, in accordance with various embodiments of the present disclosure. Such etchers include, but are not limited to, barrel etchers, plasma planar systems, electron cyclotron resonance sources, high density reflected electron sources, helicon wave sources, inductively coupled plasma sources, and transformer coupled plasma sources.

In some embodiments, a reactive ion etcher system combines plasma etching and ion beam etching principles. The systems are similar in construction to the plasma systems but have a capability of ion milling. The combination brings the benefits of chemical plasma etching along with the benefits of directional ion milling. See, e.g., Van Zant, Microchip Fabrication, Fourth Edition, McGraw-Hill, New York, 2000, pp. 256-270, which is hereby incorporated herein by reference for more information on etching techniques and etching equipment that can be used in accordance with the present disclosure.

7.10.3 Characteristics of an Etch Process.

The etch process generates an artifact or signature of the processing employed. Knowledge of how to apply etching methods determines the final profile of the structure. Definitions for the following terms are provided in order to convey an understanding of the etch processing characteristics.

Isotropic Etching. Isotropic implies equal etching in all directions. The two references are vertical and horizontal directions. An isotropic etch 'undercuts' the mask at a ratio to the vertical depth etched. Impact is that a circular opening of 1 micron when etched to a 0.5 micron depth would have a bowl like shape that is 2 microns at the top of the bowl, 1 micron at the bottom, with rounded side walls. An important consideration here is that if a conformal film were deposited over a topography/structure, an isotropic etch would remove the horizontal material as well as the side wall/vertical material. There is no shadowing or off line of sight protection from an isotropic etch (excluding rate limiting or aspect ratio physical diffusivity barriers). This characteristic is used in cleans and sacrificial film removals. One trick is to use isotopic etching to consume the side walls, thereby reducing the critical dimension.

Anisotropic Etching. Anisotropic etching is preferential etching in one direction over the other. Hence the term anisotropic: not isotropic. Ability to produce anisotropic etch chemistries allows for denser packing of devices. Anisotropy is limited by the bias and directionality of the tool utilized. The mask image is transferred into the substrate with fidelity: a 1 micron circular opening etched to 0.5 micron depth is 1 micron by 0.5 micron feature in the substrate.

An application for the disclosed technology is considering the etching of a conformal coating. If the deposited film is 0.25 microns over a 0.8 micron step, an anisotropic etch removes the 0.25 microns on the surface (horizontal surface) but leaves the side wall (vertical surface) material. Thereby an anisotropic etch results in a new structure of the deposited material where an isotropic etch would remove all material. Limitations on anisotropic etches are physical limitations that inhibit reactive species reaching the bottom surface of the etch location. These topics are defined in 'aspect ratio', 'poisoning', 'etch stops' and other terms below.

7.10.4 Etching Definitions and Examples

Etch Rate—A function of the process recipe which quantifies how fast a material is removed. Units are expressed in removed thickness per time, e.g. Angstroms per second. Etch rate includes lateral calculation as well as the vertical component. Etch rate can be reduced by addition of diluents or carrier gases that do no enhance the etch reaction. Etch rate is modified to compensate for reaction chamber design where the etch rate in the center may be higher than on the outer edge. Etch rate is sacrificed for uniformity and repeatability. High etch rates are desirable for manufacturability. However, etch rate is only one part of the grand compromise for a final etch process.

Selectivity—A comparative etch rate ratio of the desired material to be etched and the protective mask material (ratio of material etch rate over mask etch rate). A high selectivity is desired to maintain transfer of the lithography into the substrate. If the selectivity is low the differentiation between starting structure and final structure is compromised due to loss of mask. Etch chemistries are adjusted to achieve the highest selectivity possible without compromising process time for the material etch rate. High selectivity with an Angstrom per hour etch rate is not practical in typical embodiments.

Side Wall Slope—A desired etch profile could be a perfect transfer of the mask image into the substrate material with vertical sidewalls. The most common etch artifact is an oblique angle slope where the top is wider than the bottom. This can be caused from various etch conditions. A primary mechanism for this is that the etch reaction is hindered by diffusivity of the etchant, by-product interference, loss of ionization states, or competitive nonproductive reactions. In the instant disclosure, both vertical side wall, oblique and re-entry angled structures are contemplated through the disclosed etching techniques.

Re-Entrant Side Wall—The opposite of the oblique angle side wall is the re-entrant side wall angle. Here the bottom is wider than the top masked surface. This profile can be obtained by segmented etching with increasingly isotropic etch recipes. The isotropic undercuts by the lateral etch nature. The resultant structure resembles the dove tail joint in wood working Another method for reentrant side walls is the enhancement of the etch rate in the trench as a function of dopant materials.

Inhibitor Sidewall Protection Due to Byproduct Re-Deposition. Another control method for side wall profile is due to the nature of the etchant reaction. The etch reaction may generate a by-product that is not highly volatile. These compounds redeposit on the side wall during the reaction. In an isotropic etch it stops the lateral etch at the top but does not hinder at the bottom area. Re-deposition is viewed as both a positive and negative aspect of the process. Such re-deposition is advantageously used in the present disclosure.

Erosion. A method to increase the oblique slope of a side wall during an etch process is to erode the masking material at the edges. This is usually a function of heating the mask material during the etch process. This has the impact that the edge acuity of the resist is lost, resulting in the feature size being gradually reduced with etch time. Resist erosion reduces the critical dimension at the top of the feature. Examples of extreme erosion would produce teepee or pyramid like structures Etch Stop. An etch stop material is a material that has a very low etch rate that is built as a sandwich structure in a device. As the target material is etched the structure is defined. However when the etchant hits the etch stop material the maximum depth is reached. This is a method to control the depth of an etch material with high precision. Deposition sandwich can be controlled uniformly across the substrate regardless of the etch reactor design or non uniformity. A second artifact is that the amount of over etch time can be extended and only the lateral etch will continue. Lateral etch results in re-entrant slopes or critical dimension reduction.

Self Limiting or Poisoning. An etch recipe can be designed in which there is a limitation of the etchant material. Then due to physical constraint such as aspect ratio, dilution, power or bias, the effective etch is restricted. Evidence of this artifact is in deep trench, 10 to 15 microns, where there is tapering and closure. Regardless of the additional time provided the etch depth does not progress. Poisoning of the reaction has the same results but can be observed by additions to the gas stream that inhibits conversion to the desired species, or a competitive reaction that consumes the reactive species in a nonproductive reaction.

Crystalline Specific (Lattice Orientation). For mono crystalline or highly ordered lattice structures, etchants can be used to highlight and accentuate the lattice structure. For example, iodine based wet etches are used for defect analysis due to different etch rates on the crystal lattice. In some embodiments, crystalline specific etches for special substrate enhancements and for specific devices are used. In some embodiments, metallic etches can improve the surface area for the graphene growth. Moreover, nucleation approaches make use of faceting etch for graphene growth.

7.10.5 Secondary Etch Functions and Utilization

The following provides additional uses for the disclosed etching processes that are used in accordance with some embodiments of the present disclosure.

Cleaning. Etch removal of contaminates accumulated during previous processing steps can be performed. Examples of a standard etch clean process such as the RCA Clean is 1) application of distilled water, 2) application of buffered ammonium hydroxide, 3) application of dilute HF for ancient oxide, and 4) application of HCl for metallic clean. Clean procedures can also be plasma based prior to a deposition process. A clean process is removing the unwanted films prior to the following step. Cleans can be before etch steps (remove inhibitors), deposition and lithography.

Polish. A light etch step to change the profile slightly or remove unwanted residuals. For segmented film deposition a slight polish removes undesired side wall material and fine tunes by reduction of material the final film thickness.

Structure Definition. Previous discussion highlighted the side wall slope as nominal/vertical, oblique, or reentrant angled. Functional nodes can be sculpted in the profile by tuning the etch process. A simple example is the wine glass structure which was designed for metal flow into contact views. As the structures became more complex such as for plasmonics, nodes are defined by crevices or protrusion. Full structures such as a rib or ribbon can be generated by an anisotropic etch of a conformally deposited film. These concepts are captured in our portfolio as related to side walls, segmented film deposition, or fine structure lithography to name a few.

Deep Trench and Isolation of Structures. State of the art technologies have advanced to do deep trench etches with aspect ratios of 20:1 to greater. One of the benefits of trench formation is the ability to isolate structures on the same substrate. The isolation can be by air or a back fill material (dielectric or oxides. The etch process defines the isolation and the resultant critical dimension of the rib or pillar. Polarity is important because the device functionality can be buried in the bottom of the trench and the wall portions can act as thermal radiators, wave guides, or particulate traps.

Aspect Ratios. Aspect ratio is defined by the height of the structure over the width. In the etch process this impacts the diffusivity of the etchant in a narrow trench (10:1) which will slow the etchant reaction. A secondary concern is the physical stability of a tall feature on a narrow base. Such features are impacted by the microfluidic forces of subsequent processing resulting in toppling or cleavage of the structure.

Side Wall Deposition. Depending on the application and process engineering this can be a benefit or a detriment. Majority of re-deposition material during an etch process is difficult to remove with later steps (especially metal halides) which is a detriment. The rate of re-deposition can impact the profile of the structure. A benefit of re-deposition is an organic re-deposition or interaction with the photo resist that maintains the resist mask and image fidelity. This re-deposition is a corrective action for undesired resist erosion. Another example of re-deposition being beneficial is when the byproduct material can be formed for a device functionality or structure.

Etch Passivation. Slight differentiation, or subset of side wall re-deposition. During an etch step and oxidizing ambient may be used as the etchant chemistry. If there are other layers exposed such as metals (aluminum) a thin oxide will be formed which passivates the secondary surface. Other etch byproducts passivates other materials.

7.10.6 Tool Types

The present disclosure encompasses the use of a wide variety of etch tool configurations. Manufactures of such tools include, but are not limited to, Applied materials, Lam Research, Tegal, Hitachi, Oxford, Plasma Therm, and Branson to name a few. Each company has improvements or enhancements over the competitors. The following list highlights some of the designs and types of reactors on the market: barrel etchers, parallel plate, downstream etchers, ICP, TCP, sinks, spray dispense, oxidation, EBEAM oxidation, and direct write systems. For wet etch (wet sinks) there are numbers of designs for recirculation, purity, automation of multiple baths and inclusion of spin rinse dryers. Note also in the literature some tools are refined to the substrate or material designed to be etched: metal etchers, oxide etchers, etc.

7.11. Residual Layer Removal

The result of the etching process described above is the formation of grooves. Next, the residual layer is removed in a process known as resist stripping in order to yield the patterned structure. In some embodiments, the resist is stripped off with a strong acid such as $H_2SO_4$ or an acid oxidant combination, such as $H_2SO_4$—$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present disclosure, a dry plasma process is applied to remove a resist. In such embodiments, the device is placed in a chamber and oxygen is introduced. The plasma field energizes the oxygen to a high energy state, which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern devices is found in Madou, Fundamentals of Microfabrication, Second Edition, CRC Press, Boca Raton, Fla., 2002, pp. 2-65; Van Zant, Microchip Fabrication, Fourth Edition, McGraw-Hill, New York, 2000, Wolf and Tauber, Silicon Processing for the VLSI Era, Second Edition, Lattice Press, Sunset Beach, Calif., 2002; and SZE and Ng, Physics of Semiconductor Devices, Third Edition, Wiley-Interscience, 2007, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three-dimensional lithographic methods.

8. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

What is claimed is:

1. A method of forming an integrated graphite-based structure comprising:
   (A) patterning a substrate to form a plurality of elements and a plurality of trenches, each respective element in the plurality of elements separated from an adjacent element by a corresponding trench in the plurality of trenches, wherein
      (i) a first element in the plurality of elements is separated from an adjacent second element in the plurality of elements by a first trench,
      (ii) a top of the first element and a bottom of the first trench are separated by a right side wall of the first element,
      (iii) a top of the second element and the bottom of the first trench are separated by a left side wall of the second element,
      (iv) the bottom of the first trench is characterized by a trench width,
      (v) the right side wall of the first element is characterized by a right side height, and
      (vi) the left side wall of the second element is characterized by a left side height; and
   (B) depositing a metallic layer on the right side wall of the first element, the metallic layer on the right side wall of the first element having an upper end contacting the top of the first element and a lower end contacting the bottom of the first trench;
   (C) removing a layer from the top of the first element by anisotropically etching the first element, thereby producing an etched top that is lower than the top of the first element prior to etching and thereby exposing the upper end of the metallic layer on the right side wall of the first element; and
   (D) concurrently generating a first top graphene layer on the etched top of the first element and a first bottom graphene layer on the bottom of the first trench thereby forming said integrated graphite-based structure, wherein
      (i) a right side of the first top graphene layer contacts the upper end of the metallic layer on the right side wall of the first element, and
      (ii) a left side of the first bottom graphene layer contacts the lower end of the metallic layer on the right side wall of the first element.

2. The method of claim 1, wherein the patterning the substrate to form the plurality of elements and the plurality of trenches comprises etching the first trench in the substrate.

3. The method of claim 1, wherein the patterning the substrate to form the plurality of elements and the plurality of trenches comprises depositing the first element and the second element on the substrate.

4. The method of claim 1, wherein the patterning the substrate to form the plurality of elements and the plurality of trenches comprises a combination of etching the first trench in the substrate and depositing the first element and the second element adjacent to the first trench.

5. The method of claim 1, wherein the substrate comprises a dielectric material, a semiconducting material, or a combination thereof.

6. The method of claim 1, wherein the substrate comprises glass, silicon dioxide, glass ceramic, or sapphire.

7. The method of claim 1, wherein the substrate comprises silicon (Si), silicon carbide (SiC), germanium (Ge), boron nitride (BN), or molybdenum sulfide (MoS).

8. The method of claim 1, wherein the substrate comprises silicon dioxide ($SiO_2$) glass, or soda lime glass formed from $SiO_2$.

9. The method of claim 1, wherein the substrate comprises silicon dioxide glass doped with boron, barium, thorium oxide ($ThO_2$), lanthanum oxide ($La_2O_3$), iron or cerium (IV) oxide ($CeO_2$).

10. The method of claim 1, wherein the substrate comprises aluminosilicate, borosilicate, dichroic, germanium/semiconductor, glass ceramic, silicate/fused silica, soda lime, quartz, or chalcogenide/sulphide glass.

11. The method of claim 1, wherein the substrate comprises silicon carbide, and the concurrently generating the first graphene layer on the etched top of the first element and the second graphene layer on the bottom of the first trench comprises heating the substrate.

12. The method of claim 1, wherein the substrate comprises silicon or silicon carbide, and the concurrently generating the first graphene layer on the etched top of the first element and the second graphene layer on the bottom of the first trench comprises:
   doping the etched top of the first element and the bottom of the first trench with carbon, and
   heating the substrate.

13. The method of claim 1, further comprising:
   depositing, subsequently to the removing but prior to the concurrently generating, a graphene generation material on the etched top of the first element and on the bottom of the first trench, wherein the substrate is made of a dielectric material.

14. The method of claim 13, wherein the depositing the graphene generation material on the etched top of the first element and on the bottom of the first trench is conducted concurrently.

15. The method of claim 13, wherein the depositing the graphene generation material is conducted using a spin-on-glass process or a diluted solution.

16. The method of claim 13, wherein the graphene generation material comprises silicon carbide, and the concurrently generating the first graphene layer on the etched top of the first element and the second graphene layer on the bottom of the first trench comprises heating the substrate.

17. The method of claim 13, wherein the graphene generation material comprises silicon or silicon carbide, and the concurrently generating the first graphene layer on the etched top of the first element and the second graphene layer on the bottom of the first trench comprises:
  doping the graphene generation material deposited on the etched top of the first element and on the bottom of the first trench with carbon, and
  heating the substrate.

18. The method of claim 1 wherein
  the first graphene layer comprises between 3 and 500 graphene sheets,
  the second graphene layer comprises between 3 and 500 graphene sheets,
  between 3 and 500 graphene sheets in the first top graphene layer contacts the upper end of the metallic layer on the right side wall of the first element, and
  between 3 and 500 graphene sheets in the first bottom graphene layer contacts the lower end of the metallic layer on the right side wall of the first element.

19. An integrated graphite-based structure, comprising:
  a substrate comprising a first metal or metal alloy;
  a plurality of elements and a plurality of trenches disposed on the substrate, each respective element in the plurality of elements comprising a second metal or metal alloy and separated from an adjacent element in the plurality of elements by a corresponding trench in the plurality of trenches;
  an insulating layer comprising a first dielectric material, wherein the insulating layer is overlayed on the substrate and exposed portions of the plurality of elements;
  a plurality of top graphene layers, each respective top graphene layer in the plurality of top graphene layers formed on the portion of the insulating layer that is on a top surface of a corresponding element in the plurality of elements;
  a plurality of bottom graphene layers, each respective bottom graphene layer in the plurality of bottom graphene layers is overlaid on the portion of the insulating layer that is on the bottom of a trench in the plurality of trenches; and
  a plurality of metallic layers, wherein
    each respective metallic layer in the plurality of metallic layers is formed on the portion of the insulating layer coating a side wall of a corresponding element in the plurality of elements, and
    each respective metallic layer in the plurality of metallic layers contacts one top graphene layer in the plurality of top graphene layers at an upper end thereof and one bottom graphene layer in the plurality of bottom graphene layers at a lower end thereof.

20. The integrated graphite-based structure of claim 19, wherein the first metal or metal alloy and the second metal or metal alloy are the same.

* * * * *